US012745393B2

(12) United States Patent
Hosotani et al.

(10) Patent No.: US 12,745,393 B2
(45) Date of Patent: Sep. 22, 2026

(54) SEMICONDUCTOR MEMORY DEVICE

(71) Applicant: Kioxia Corporation, Tokyo (JP)

(72) Inventors: Keiji Hosotani, Yokkaichi Mie (JP); Fumitaka Arai, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 892 days.

(21) Appl. No.: 17/944,063

(22) Filed: Sep. 13, 2022

(65) Prior Publication Data

US 2023/0014439 A1 Jan. 19, 2023

Related U.S. Application Data

(63) Continuation of application No. PCT/JP2020/013071, filed on Mar. 24, 2020.

(51) Int. Cl.

| | |
|---|---|
| ***H10B 43/27*** | (2023.01) |
| ***H01L 23/522*** | (2006.01) |
| ***H01L 23/528*** | (2006.01) |
| ***H10B 43/10*** | (2023.01) |
| ***H10B 43/35*** | (2023.01) |

(Continued)

(52) U.S. Cl.
CPC ............. *H10B 43/27* (2023.02); *H10B 43/10* (2023.02); *H10B 43/35* (2023.02); *H10W 20/42* (2026.01); *H10W 20/435* (2026.01)

(58) Field of Classification Search
CPC ........ H10B 43/27; H10B 43/10; H10B 43/35; H10B 43/20; H01L 23/5226; H01L 23/5283; G11C 16/0483; H10D 30/021; H10W 20/42; H10W 20/435
See application file for complete search history.

(56) References Cited

U.S. PATENT DOCUMENTS

| | | | |
|---|---|---|---|
| 7,382,018 B2 | 6/2008 | Kim et al. | |
| 10,236,254 B1 * | 3/2019 | Arai | H10B 43/35 |
| 11,107,508 B2 | 8/2021 | Hosotani et al. | |

(Continued)

FOREIGN PATENT DOCUMENTS

| | | |
|---|---|---|
| JP | 2008-078404 A | 4/2008 |
| JP | 2011-527515 A | 10/2011 |

(Continued)

OTHER PUBLICATIONS

International Search Report and Written Opinion from PCT Appl. Ser. No. PCT/JP2020/013071 mailed Jun. 16, 2020, with partial English translation (12 pages).

*Primary Examiner* — Steven B Gauthier
*Assistant Examiner* — Khatib A Rahman
(74) *Attorney, Agent, or Firm* — Foley & Lardner LLP

(57) ABSTRACT

According to one embodiment, a semiconductor memory device includes the following structure. First and second semiconductor layers extend in a first direction. The second semiconductor layer is stacked apart from the first semiconductor layer in a second direction. First, second and third conductive layers and a first insulating layer extend in the second direction and intersect the first and second semiconductor layers. The first insulating layer is provided at a first distance from the first conductive layer in the first direction. The second conductive layer is provided at the first distance from the first insulating layer in the first direction. The third conductive layer is provided at the first distance from the second conductive layer in the first direction.

15 Claims, 21 Drawing Sheets

(51) Int. Cl.
*H10W 20/41* (2026.01)
*H10W 20/42* (2026.01)

(56) References Cited

U.S. PATENT DOCUMENTS

| | | | | |
|---|---|---|---|---|
| 11,227,832 | B2 | 1/2022 | Hosotani et al. | |
| 2008/0073635 | A1 | 3/2008 | Kiyotoshi et al. | |
| 2010/0097858 | A1 | 4/2010 | Tokiwa et al. | |
| 2011/0169067 | A1 | 7/2011 | Ernst et al. | |
| 2013/0126959 | A1* | 5/2013 | Aburada | H10P 76/4085 438/269 |
| 2014/0027835 | A1* | 1/2014 | Tanaka | H10B 43/27 438/591 |
| 2015/0340369 | A1 | 11/2015 | Lue | |
| 2016/0078949 | A1 | 3/2016 | Abe et al. | |
| 2016/0141299 | A1 | 5/2016 | Hong | |
| 2020/0176033 | A1* | 6/2020 | Hosotani | G11C 16/0483 |
| 2020/0286828 | A1* | 9/2020 | Hosotani | H10B 43/10 |
| 2020/0294595 | A1* | 9/2020 | Shiga | G11C 11/005 |

FOREIGN PATENT DOCUMENTS

| | | | |
|---|---|---|---|
| JP | 2015-228484 | A | 12/2015 |
| JP | 2016-062624 | A | 4/2016 |
| JP | 2016-100596 | A | 5/2016 |
| JP | 2020-092141 | A | 6/2020 |
| JP | 2020-145296 | A | 9/2020 |

* cited by examiner

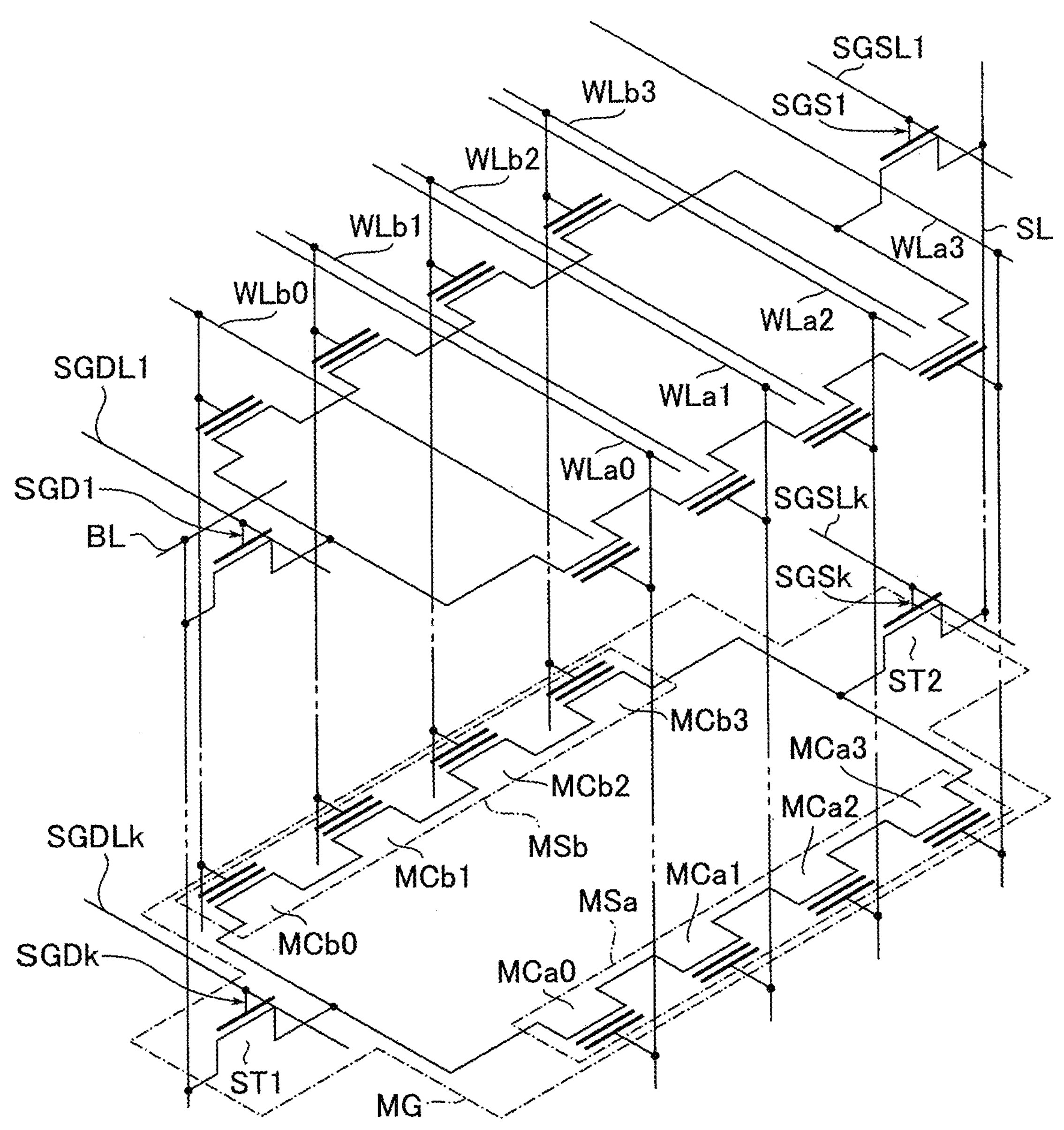
F I G. 3

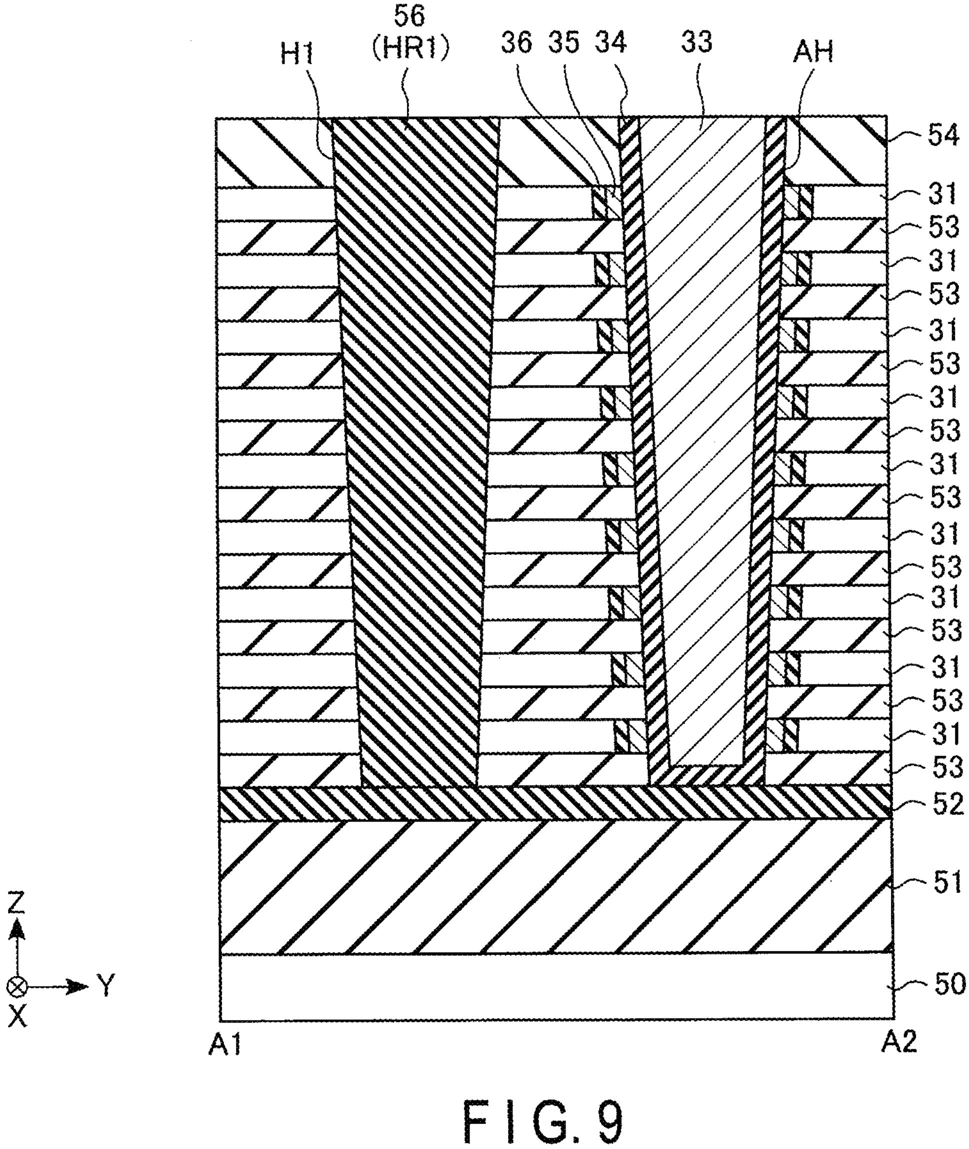
F I G. 9

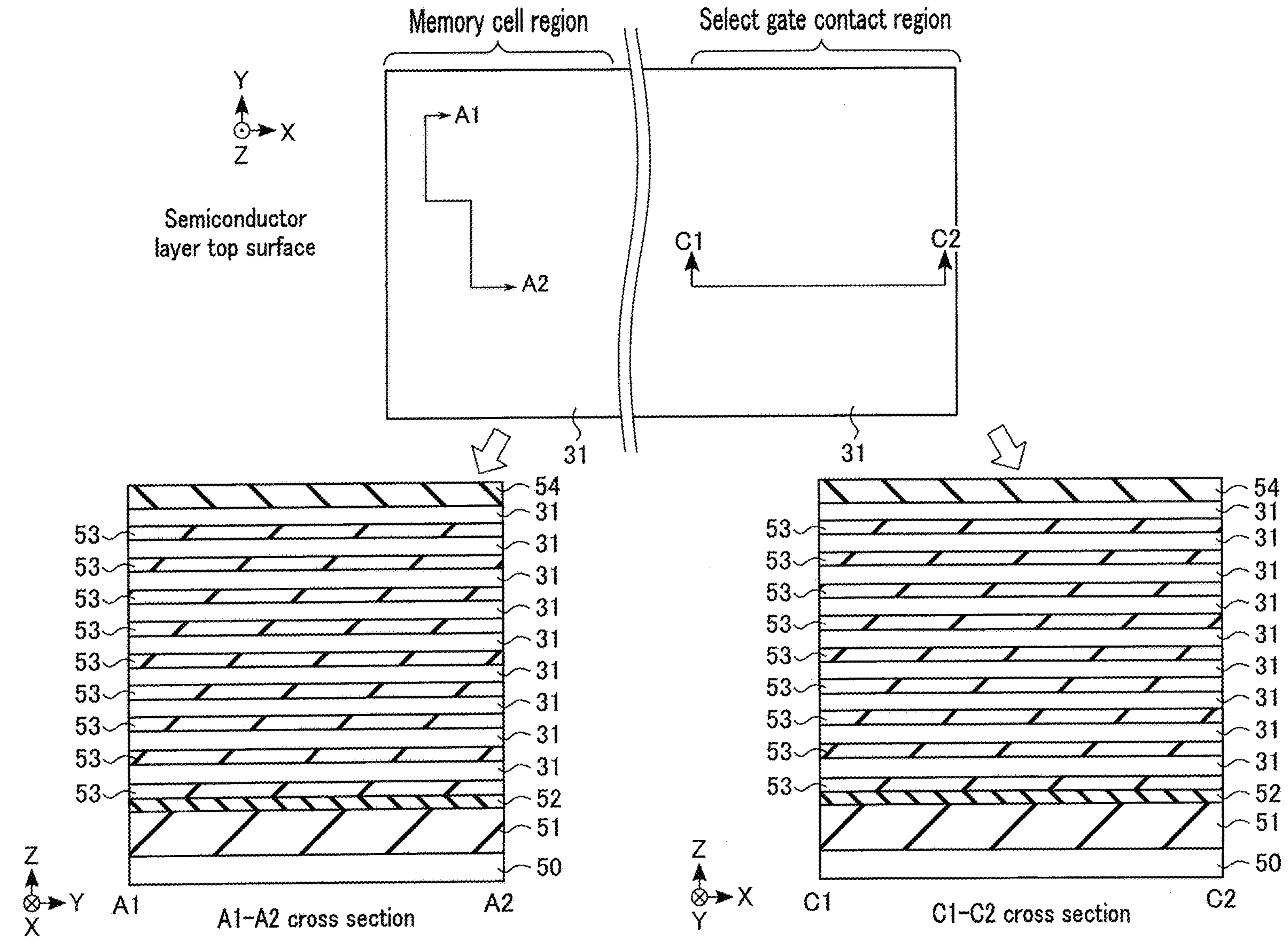
F I G. 11

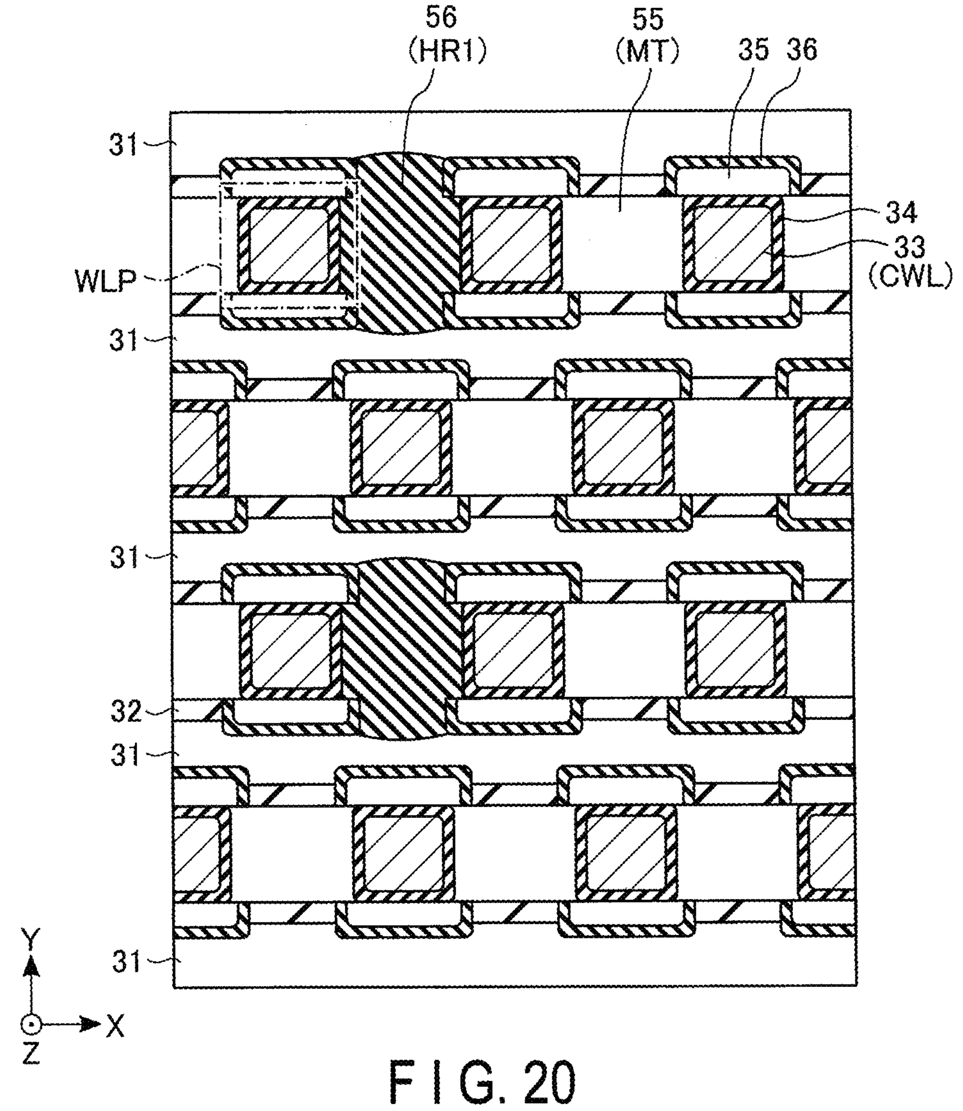
F I G. 20

SEMICONDUCTOR MEMORY DEVICE

CROSS-REFERENCE TO RELATED APPLICATIONS

This application is a Continuation Applications of PCT Application No. PCT/JP2020/013071, filed Mar. 24, 2020, the entire contents of all of which are incorporated herein by reference.

FIELD

Embodiments described herein relate to a semiconductor memory device.

BACKGROUND

A semiconductor memory device in which memory cells are three-dimensionally arranged is known.

BRIEF DESCRIPTION OF THE DRAWINGS

FIG. 3 is a circuit diagram of the memory cell array in the first embodiment.

FIG. 5 is a circuit diagram showing couplings between select gate lines and global select gate lines in the first embodiment.

FIG. 9 is a cross-sectional view of the memory cell region in the first embodiment, taken along line A1-A2.

FIGS. 11 to 17 are diagrams showing a manufacturing method in the semiconductor memory device according to the first embodiment.

FIG. 20 is an enlarged diagram of a memory cell region in the second embodiment.

DETAILED DESCRIPTION

In general, according to one embodiment, a semiconductor memory device includes a first semiconductor layer, a second semiconductor layer, a first conductive layer, a first insulating layer, a second conductive layer and a third conductive layer. The first semiconductor layer extends in a first direction. The second semiconductor layer extends in the first direction and is stacked apart from the first semiconductor layer in a second direction intersecting the first direction. The first conductive layer extends in the second direction and intersects the first semiconductor layer and the second semiconductor layer. The first insulating layer extends in the second direction, intersects the first semiconductor layer and the second semiconductor layer, and is provided at a first distance from the first conductive layer in the first direction. The second conductive layer extends in the second direction, intersects the first semiconductor layer and the second semiconductor layer, and is provided at the first distance from the first insulating layer in the first direction. The third conductive layer extends in the second direction, intersects the first semiconductor layer and the second semiconductor layer, and is provided at the first distance from the second conductive layer in the first direction.

Hereinafter, embodiments will be described with reference to the accompanying drawings. In the descriptions below, constituent elements having substantially the same function and configuration will be assigned a common reference symbol. Each of the embodiments described below merely indicates an exemplary apparatus or method for embodying the technical idea of the embodiment. The element materials, shapes, structures, arrangements, etc. of the technical idea of each embodiment are not limited to the ones described below. The technical ideas of the embodiments may be variously modified within the scope of the claims. Hereinafter, a three-dimensionally stacked type NAND flash memory, in which memory cell transistors are three-dimensionally stacked above a semiconductor substrate, will be described as an example of the semiconductor memory device of each embodiment.

1. First Embodiment

Hereinafter, a description will be given of a semiconductor memory device according to a first embodiment.

1.1 Configuration of Semiconductor Memory Device

1.1.1 Circuit Configuration of Semiconductor Memory Device

Figure 1:
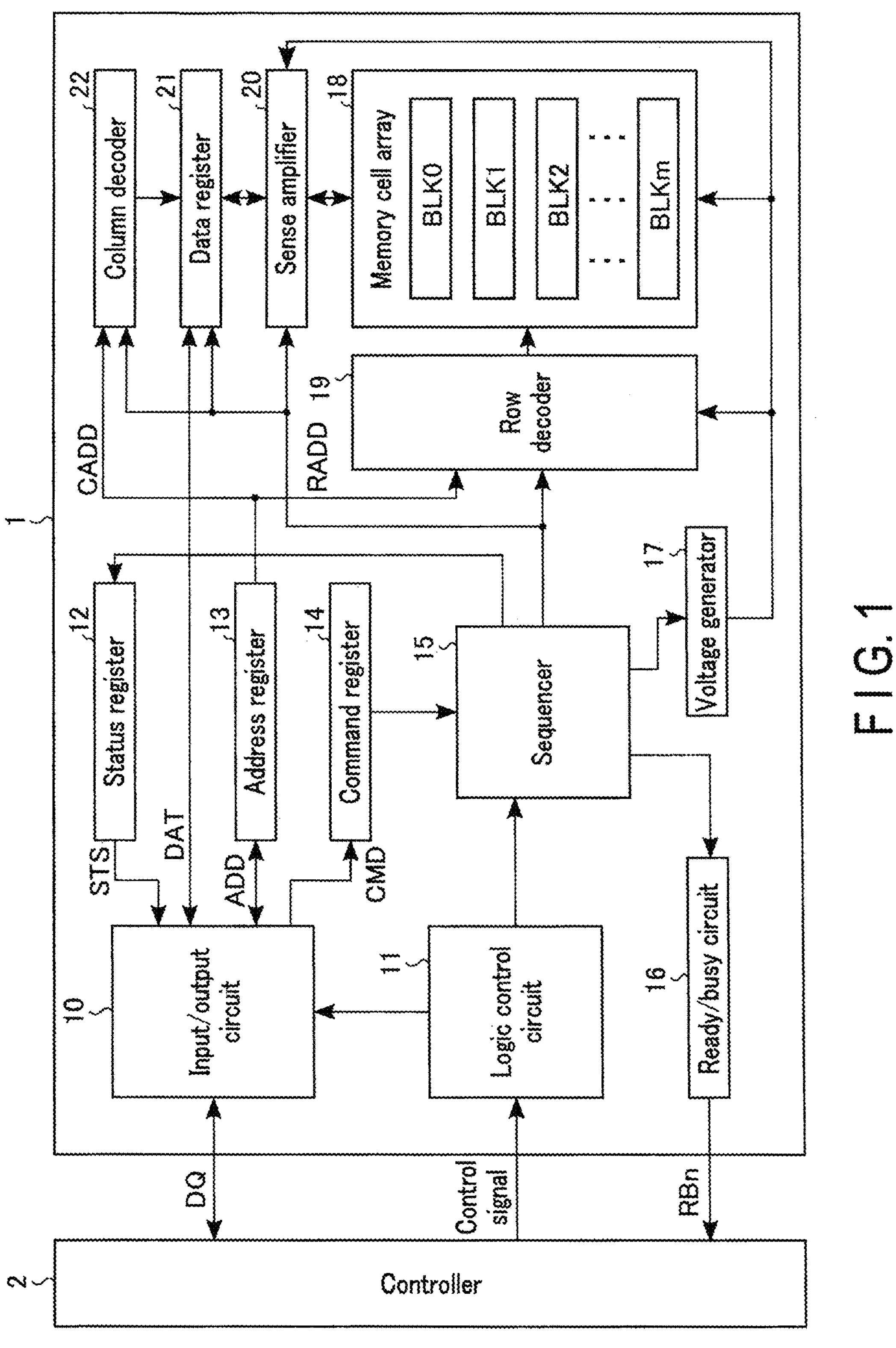
FIG. 1 is a block diagram showing a circuit configuration of a semiconductor memory device according to a first embodiment.

First, a circuit configuration of the semiconductor memory device will be described with reference to FIG. 1. FIG. 1 is an example of a block diagram showing the circuit configuration of the semiconductor memory device. In FIG. 1, some of the couplings between the blocks are indicated by arrows; however, the couplings between the blocks are not limited to those shown in FIG. 1.

As shown in FIG. 1, the semiconductor memory device 1 includes an input/output circuit 10, a logic controller 11, a status register 12, an address register 13, a command register 14, a sequencer 15, a ready/busy circuit 16, a voltage generator 17, a memory cell array 18, a row decoder 19, a sense amplifier 20, a data register 21, and a column decoder 22.

The input/output circuit 10 controls input and output of a signal DQ to and from an external controller 2. The signal DQ includes, for example, data DAT, an address ADD, and a command CMD. Specifically, the input/output circuit 10 transmits the data DAT, address ADD, and command CMD received from the controller 2 to the data register 21, address register 13, and command register 14, respectively. The input/output circuit 10 also transmits status information STS received from the status register 12, the data DAT received from the data register 21, the address ADD received from the address register 13, etc. to the controller 2.

The logic controller 11 receives various control signals from the controller 2. The logic controller 11 controls the input/output circuit 10 and the sequencer 15 according to the received control signals.

The status register 12 temporarily stores, for example, status information STS in a write operation, a read operation, or an erase operation, and notifies the controller 2 of whether or not the operation has been completed normally.

The address register 13 temporarily stores the received address ADD. The address ADD includes a row address RADD and a column address CADD. The address register 13 transfers the row address RADD to the row decoder 19, and transfers the column address CADD to the column decoder 22.

The command register 14 temporarily stores the received command CMD, and transfers it to the sequencer 15.

The sequencer 15 controls the operations of the entire semiconductor memory device 1. Specifically, according to the received command CMD, the sequencer 15 controls, for example, the status register 12, the ready/busy circuit 16, the voltage generator 17, the row decoder 19, the sense amplifier 20, the data register 21, the column decoder 22, etc. to execute the write operation, the read operation, the erase operation, etc.

The ready/busy circuit 16 transmits a ready/busy signal RBn to the controller 2 according to an operation status of the sequencer 15.

The voltage generator 17 generates various voltages used in the write operation, the read operation, and the erase operation under control of the sequencer 15, and supplies the generated voltages to, for example, the memory cell array 18, the row decoder 19, the sense amplifier 20, etc. The row decoder 19 and the sense amplifier 20 apply the voltages supplied from the voltage generator 17 to memory cell transistors in the memory cell array 18.

The memory cell array 18 includes a plurality of blocks BLK0, BLK1, BLK2, . . . , and BLKm (m is an integer of 0 or more), each including a plurality of nonvolatile memory cell transistors (hereinafter also referred to as "memory cells") each associated with a row and a column. Hereinafter, if the blocks BLK0 to BLKm are not distinguished from one another, each block will be referred to as the block BLK.

The block BLK includes a plurality of memory units MU. Each memory unit MU includes a plurality of memory groups MG. Note that the number of blocks BLK in the memory cell array 18, the number of memory units MU in the block BLK, and the number of memory groups MG in each memory unit MU can be freely set. The memory cell array 18 will be described in detail later.

The row decoder 19 decodes the row address RADD. Based on a result of the decoding, the row decoder 19 applies a control voltage supplied from the voltage generator 17 to the memory cell transistors in the memory cell array 18.

The sense amplifier 20 senses data read from the memory cell array 18 in the read operation. Then, the sense amplifier 20 transmits the read data to the data register 21. In the write operation, the sense amplifier 20 transmits write data to the memory cell array 18.

The data register 21 includes a plurality of latch circuits. The latch circuits temporarily store write data or read data.

The column decoder 22 decodes the column address CADD and selects the latch circuit in the data register 21 based on a result of the decoding in the write operation, the read operation, and the erase operation, for example.

1.1.2. Overall Configuration of Memory Cell Array

Figure 2:
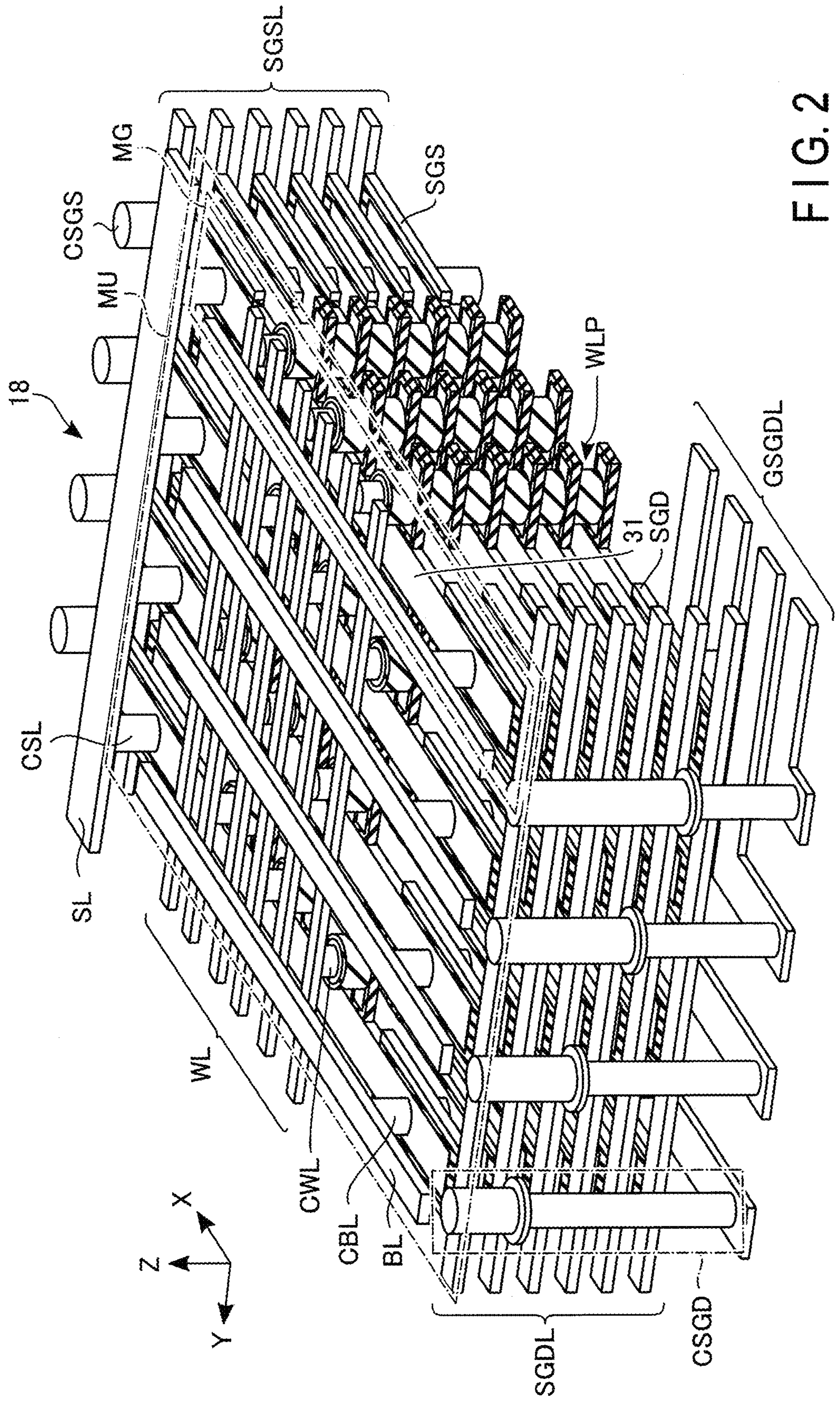
FIG. 2 is a perspective view of a memory cell array in the first embodiment.

Next, an overall configuration of the memory cell array 18 will be described with reference to FIG. 2. FIG. 2 is a perspective view of the memory cell array 18. In the example of FIG. 2, some insulating layers between conductive layers are omitted.

As shown in FIG. 2, the memory cell array 18 includes a plurality of semiconductor layers 31, a plurality of word line pillars WLP, a plurality of word lines WL, a plurality of select gates SGD and SGS, a plurality of contact plugs CSGD and CSGS, a plurality of select gate lines SGDL and SGSL, a plurality of global select gate lines GSGDL, a plurality of contact plugs CBL, a plurality of bit lines BL, a plurality of contact plugs CSL, and a source line SL.

Each of the semiconductor layers 31 corresponds to one memory group MG to be described later, and functions as an active area in which channel layers of a plurality of memory cell transistors MC and select transistors ST1 and ST2 are formed. The semiconductor layers 31 extend in the X direction, which is parallel to the semiconductor substrate, and are stacked apart from one another (with insulating layers (not shown) interposed therebetween) in the Z direction, which is perpendicular to the semiconductor substrate. Sets of the semiconductor layers 31 stacked in the Z direction are arranged along the Y direction, which is parallel to the semiconductor substrate and is orthogonal to (or intersects) the X direction.

Between the semiconductor layers 31 arranged in the Y direction, the word line pillars WLP extending in the Z direction are arranged along the X direction. In other words, a set of the word line pillars WLP arranged along the X direction and a set of the semiconductor layers 31 stacked in the Z direction are alternately arranged along the Y direction. The word lines WL extending in the Y direction are provided above the word line pillars WLP. Each of the word line pillars WLP includes a contact plug CWL (hereinafter also referred to as an "interconnect CWL") electrically coupled to a word line WL provided above the word line pillar WLP, and a block insulating layer formed on the side surface of the word line pillar WLP. In the layer at the same level as each of the semiconductor layers 31 from the semiconductor substrate, the block insulating layer, a charge storage layer, and a tunnel insulating layer are provided between the contact plug CWL of each word line pillar WLP and the semiconductor layer 31.

One memory cell transistor MC is provided at a position where one word line pillar WLP intersects its corresponding semiconductor layer 31. The memory cell transistors MC are coupled in the X direction through the semiconductor layer 31. In other words, the channels of the memory cell transistors MC are coupled in the X direction.

A contact plug CBL is provided in the vicinity of one X-directional end of each set of the semiconductor layers 31 stacked in the Z direction. The contact plug CBL passes through the semiconductor layers 31 stacked in the Z direction, and is coupled to these semiconductor layers 31. The contact plugs CBL are provided to correspond to the semiconductor layers 31 arranged along the Y direction. A bit line BL extending in the X direction is provided on each contact plug CBL. The contact plugs CBL are coupled to different bit lines BL.

A contact plug CSL is provided in the vicinity of the other X-directional end of each set of the semiconductor layers 31 stacked in the Z direction. The contact plug CSL passes through the semiconductor layers 31 stacked in the Z direction, and is coupled to these semiconductor layers 31. A plurality of contact plugs CSL are provided to correspond to the semiconductor layers 31 arranged along the Y direction. A source line SL extending in the Y direction is provided on the contact plugs CSL. The contact plugs CSL are coupled in common to the source line SL.

The X-directional ends, on which the contact plugs CBL are arranged, of the semiconductor layers 31 arranged in a single layer along the Y direction are provided with individual select gates SGD via different insulating layers, and these select gates SGD provided in the same layer are coupled in common to a select gate line SGDL extending in the Y direction. Thus, the semiconductor layers 31 and the select gate line SGDL are not electrically coupled to each other. Similarly, the other X-directional ends, on which the contact plugs CSL are arranged, of the semiconductor layers 31 arranged in a single layer along the Y direction are provided with individual select gates SGS via different insulating layers, and these select gates SGS provided in the same layer are coupled in common to a select gate line SGSL extending in the Y direction. Thus, the semiconductor layers 31 and the select gate line SGSL are not electrically coupled to each other. A plurality of select gate lines SGDL and SGSL are stacked to correspond to their respective semiconductor layers 31 stacked in the Z direction.

A plurality of global select gate lines GSGDL are provided along the XY plane below the semiconductor layers 31 stacked in the Z direction and the select gate lines SGDL.

At an intersection of the select gate lines SGDL and each global select gate line GSGDL, a contact plug CSGD extending in the Z direction is arranged. A plurality of contact plugs CSGD are arranged along the Y direction. Each of the contact plugs CSGD has a coupling portion that is electrically coupled to any one of the select gate lines SGDL. That is, each of the contact plugs CSGD electrically couples any one of the global select gate lines GSGDL to any one of the select gate lines SGDL. In the example of FIG. 2, the coupling portions of the contact plugs CSGD arranged along the Y direction are respectively coupled to the select gate lines SGDL at different layers.

A plurality of global select gate lines GSGSL (not shown) are provided along the XY plane below the semiconductor layers 31 stacked in the Z direction and the select gate lines SGSL.

At an intersection of the select gate lines SGSL and each global select gate line GSGSL, a contact plug CSGS extending in the Z direction is provided. A plurality of contact plugs CSGS are arranged along the Y direction. Each of the contact plugs CSGS has a coupling portion that is electrically coupled to any one of the select gate lines SGSL. That is, each of the contact plugs CSGS electrically couples any one of the global select gate lines GSGSL to any one of the select gate lines SGSL.

A plurality of memory groups MG (semiconductor layers 31) arranged along the Y direction and corresponding to one select gate line SGDL and one select gate line SGSL are included in one memory unit MU. A plurality of memory units MU sharing the word line pillars WLP are included in one block BLK.

1.1.3. Circuit Configuration of Memory Cell Array

Figure 4:
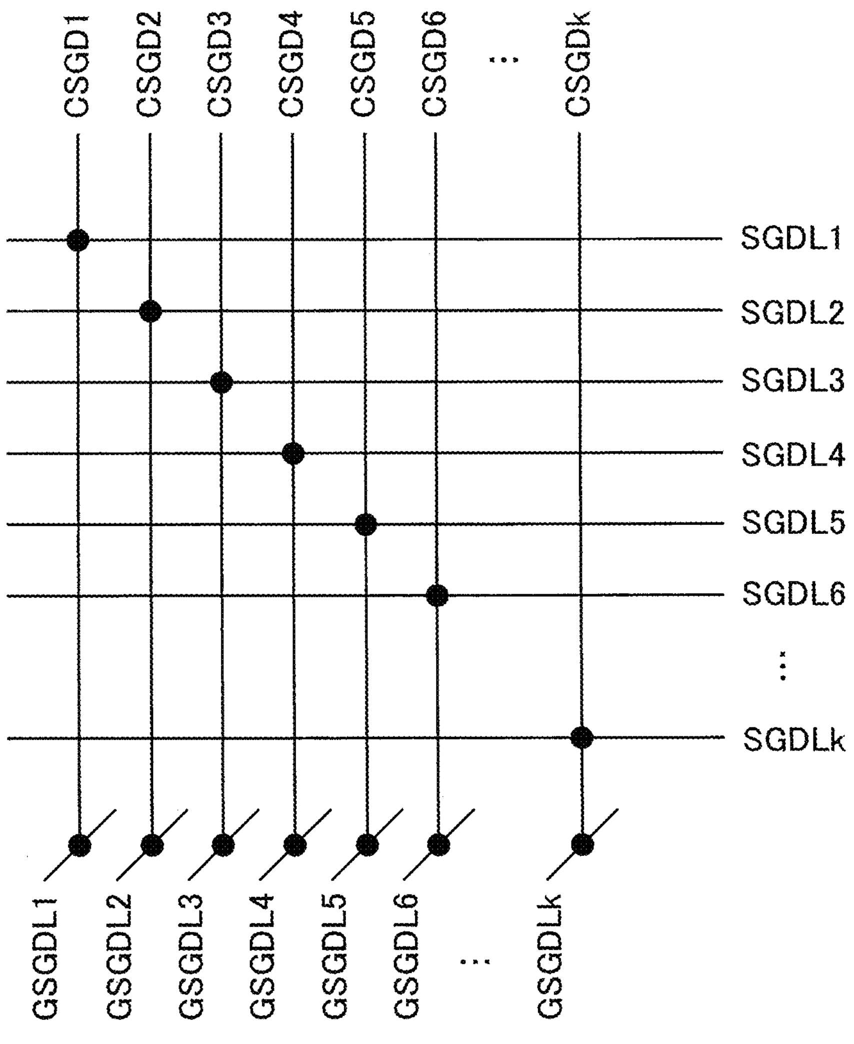
FIGS. 4 and 5 are circuit diagrams showing couplings between select gate lines and global select gate lines in the first embodiment.
Figure 5:
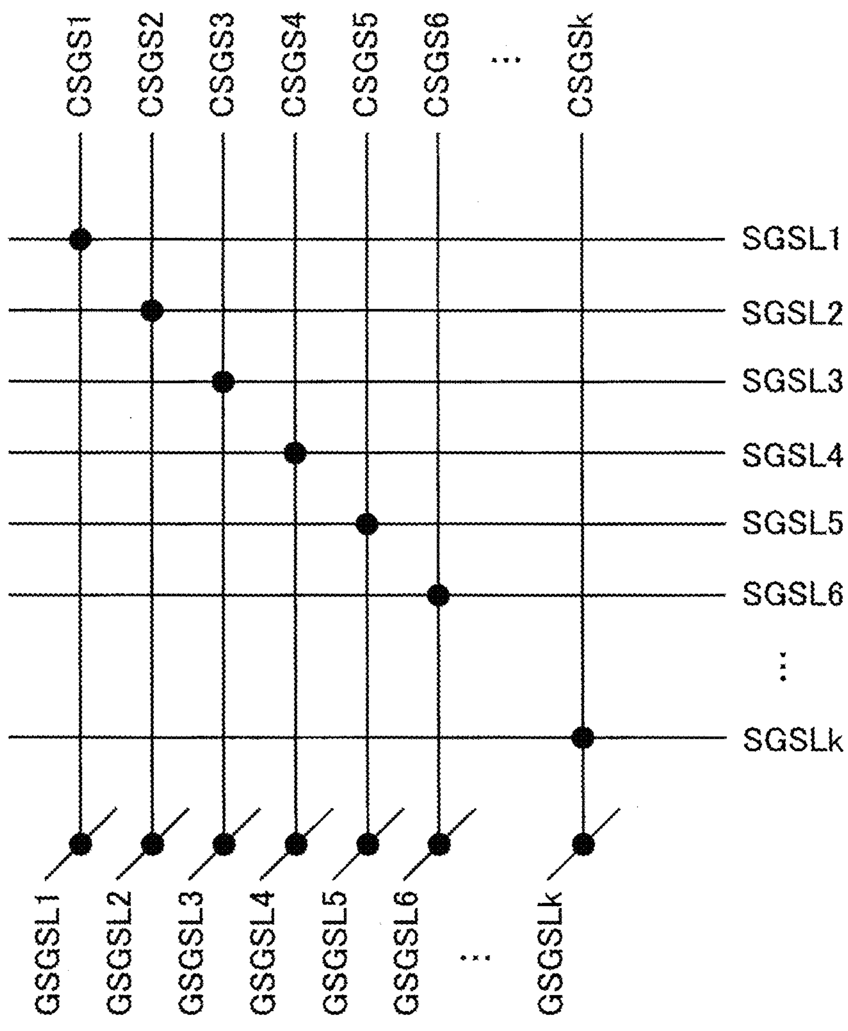

Next, a circuit configuration of the memory cell array 18 will be described with reference to FIGS. 3 to 5. FIG. 3 is a circuit diagram of the memory cell array 18. FIG. 4 is a circuit diagram showing couplings between the select gate lines SGDL and the global select gate lines GSGDL. FIG. 5 is a circuit diagram showing couplings between the select gate lines SGSL and the global select gate lines GSGSL.

The example of FIG. 3 shows a plurality of memory groups MG corresponding to a plurality of semiconductor layers 31 which are stacked in the Z direction and coupled in common to one contact plug CBL. The example of FIG. 4 shows contact plugs CSGD and global select gate lines GSGDL coupled to their respective select gate lines SGDL stacked in the Z direction. The example of FIG. 5 shows contact plugs CSGS and global select gate lines GSGSL connected to their respective select gate lines SGSL stacked in the Z direction. Hereinafter, the select gate lines corresponding to the uppermost semiconductor layers 31 (memory groups MG) will be referred to as SGDL1 and SGSL1, and the select gate lines corresponding to the lowermost semiconductor layers 31 (memory groups MG) will be referred to as SGDLk and SGSLk (k is an integer of 2 or more).

As shown in FIG. 3, the memory cell array 18 includes a plurality of memory groups MG. Each of the memory groups MG includes two memory strings MSa and MSb and select transistors ST1 and ST2. Hereinafter, if the memory strings MSa and MSb are not distinguished from one another, each memory string will be referred to as the memory string MS.

The memory string MSa includes, for example, four memory cell transistors MCa0 to MCa3. Similarly, the memory string MSb includes, for example, four memory cell transistors MCb0 to MCb3. Hereinafter, if the memory cell transistors MCa0 to MCa3 and MCb0 to MCb3 are not distinguished from one another, each memory cell transistor will be referred to as the memory cell transistor MC.

The memory cell transistor MC includes a control gate and a charge storage layer, and stores data in a nonvolatile manner. The memory cell transistor MC may be of a floating gate (FG) type which uses a conductive layer as the charge storage layer, or of a metal-oxide-nitride-oxide-silicon (MONOS) type which uses an insulating layer (or dielectric layer) as the charge storage layer. The number of memory cell transistors MC included in each memory string MS may be, but should not be limited to, 8, 16, 32, 48, 64, 96, 128, or the like.

The current paths of the memory cell transistors MCa0 to MCa3 included in the memory string MSa are coupled in series. Similarly, the current paths of the memory cell transistors MCb0 to MCb3 included in the memory string MSb are coupled in series. The drains of the memory cell transistors MCa0 and MCb0 are coupled in common to the source of the select transistor ST1. The sources of the memory cell transistors MCa3 and MCb3 are coupled in common to the drain of the select transistor ST2. The numbers of select transistors ST1 and ST2 included in the memory group MG can be freely set, and each number only has to be one or more.

The gates of the memory cell transistors MC of the memory groups MG arranged along the Z direction are coupled in common to one word line WL via the contact plug CWL of the word line pillar WLP. Specifically, for example, the gates of the memory cell transistors MCa0 arranged in the Z direction are coupled in common to a word line WLa0. Similarly, the gates of the memory cell transistors MCa1, MCa2, and MCa3 are coupled to word lines WLa1, WLa2, and WLa3, respectively. The gates of the memory cell transistors MCb0 to MCb3 are coupled to word lines WLb0 to WLb3, respectively.

The drains of the select transistors ST1 of the memory groups MG arranged along the Z direction are coupled in common to one bit line BL via the contact plug CBL. The select gates SGD of the select transistors ST1 of the memory groups MG arranged along the Z direction are coupled to different select gate lines SGDL. Specifically, for example, a select gate SGD1 of the select transistor ST1 corresponding to the memory group MG arranged in the uppermost layer is coupled to the select gate line SGDL1. The select gate SGDk of the select transistor ST1 corresponding to the memory group MG arranged in the lowermost layer is coupled to the select gate line SGDLk.

The sources of the select transistors ST2 of the memory groups MG arranged along the Z direction are coupled in common to one source line SL via the contact plug CSL. The select gates SGS of the select transistors ST2 of the memory groups MG arranged along the Z direction are coupled to different select gate lines SGSL. Specifically, for example, a select gate SGS1 of the select transistor ST2 corresponding to the memory group MG arranged in the uppermost layer is coupled to a select gate line SGSL1, and a select gate SGSk of the select transistor ST2 corresponding to the memory group MG arranged in the lowermost layer is coupled to the select gate line SGSLk.

Next, couplings between the select gate lines SGDL, the contact plugs CSGD, and the global select gate lines GSGDL will be described with reference to FIG. 4. Hereinafter, the contact plugs CSGD corresponding to their respective select gate lines SGDL1 to SGDLk stacked in the Z direction will be referred to as CSGD1 to CSGDk, and the global select gate lines GSGDL will be referred to as GSGDL1 to GSGDLk, respectively.

As shown in FIG. 4, the select gate line SGDL1 is coupled to the global select gate line GSGDL1 via the contact plug CSGD1. The same is true of the other select gate lines SGDL. That is, the select gate lines SGDL stacked in the Z direction are coupled to the different global select gate lines GSGDL via the different contact plugs CSGD.

Next, couplings between the select gate lines SGSL, the contact plugs CSGS, and the global select gate lines GSGSL will be described with reference to FIG. 5. Hereinafter, the contact plugs CSGS corresponding to their respective select gate lines SGSL1 to SGSLk stacked in the Z direction will be referred to as CSGS1 to CSGSk, and the global select gate lines GSGSL will be referred to as GSGSL1 to GSGSLk.

As shown in FIG. 5, the select gate line SGSL1 is coupled to the global select gate line GSGSL1 via the contact plug CSGS1. The same is true of the other select gate lines SGSL. That is, the select gate lines SGSL stacked in the Z direction are coupled to the different global select gate lines GSGSL via the different contact plugs CSGS.

Figure 6:
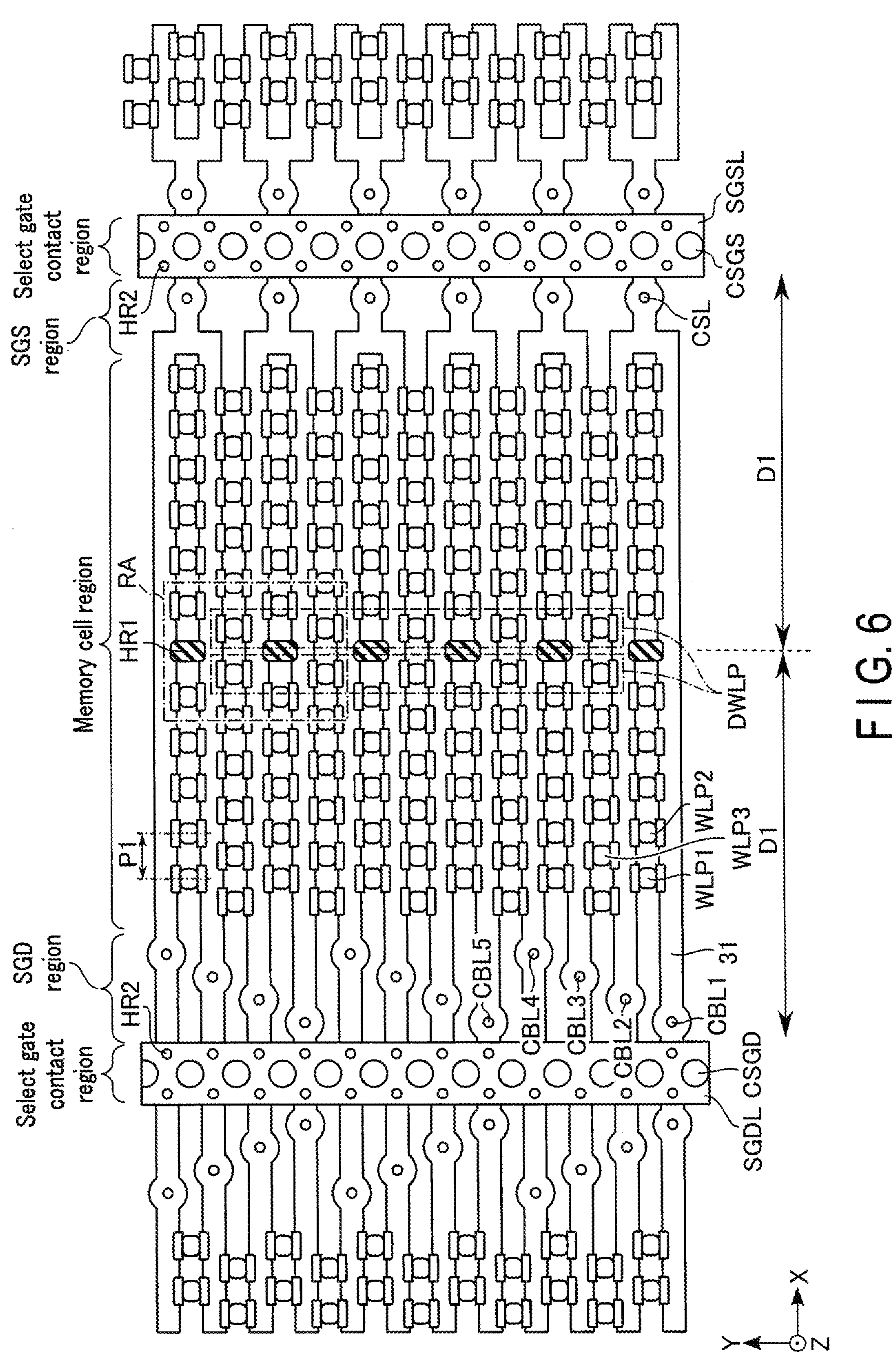
FIG. 6 is a diagram showing a layout configuration of the memory cell array in the first embodiment.

1.1.4 Layout Configuration and Cross-Sectional Structure of Memory Cell Array 1.1.4.1 Layout Configuration of Memory Cell Array Next, an example of a layout configuration of the memory cell array 18 will be described with reference to FIG. 6. FIG. 6 is a diagram showing a layout configuration of the memory cell array 18, and is a top view of the semiconductor layers 31 and select gate lines SGDL and SGSL in the uppermost layer. In the example of FIG. 6, some of the insulating layers are omitted.

As shown in FIG. 6, the memory cell array 18 includes a memory cell region, an SGD region, an SGS region, a select gate contact region corresponding to the select gate line SGDL, and a select gate contact region corresponding to the select gate line SGSL.

The memory cell transistors MC are provided in the memory cell region. The memory cell transistor MC includes a part of the semiconductor layer 31, a word line pillar WLP, and a block insulating layer, a charge storage layer, and a tunnel insulating layer to be described later. Hereinafter, in the description of the layout configuration, the memory cell transistor MC may be simply described as the word line pillar WLP.

The SGD region is provided adjacent to the memory cell region in the X direction, and functions as a coupling area between the semiconductor layers 31 and the contact plugs CBL. The select transistors ST1 are provided in the SGD region. The SGS region is provided adjacent to the memory cell region in the X direction, and functions as a coupling area between the semiconductor layers 31 and the contact plugs CSL. The select transistors ST2 are provided in the SGS region.

The select gate contact region corresponding to the select gate line SGDL is provided adjacent to the SGD region in the X direction, and the contact plugs CSGD are coupled to the select gate line SGDL. The select gate contact region corresponding to the select gate line SGSL is provided adjacent to the SGS region in the X direction, and the contact plugs CSGS are coupled to the select gate line SGSL. The numbers of memory cell regions, SGD regions, SGS regions, select gate contact regions corresponding to the select gate lines SGDL, and select gate contact regions corresponding to the select gate lines SGSL included in the memory cell array 18 can be freely set.

A configuration of the memory cell region will be described below.

A plurality of (12 in the example of FIG. 6) semiconductor layers 31 extending in the X direction (or a row direction) are arranged along the Y direction (or a column direction). Between the semiconductor layers 31 in the Y direction, the word line pillars WLP are arranged in a staggered manner in the X direction and the Y direction. For example, word line pillars WLP1 and WLP2 are arranged adjacent to each other in the X direction, and a word line pillar WLP3 is arranged between the word line pillars WLP1 and WLP2 in the X direction and at a position different from the word line pillars WLP1 and WLP2 in the Y direction. Specifically, between two semiconductor layers 31, a plurality of (11 or 12 in the example of FIG. 6) word line pillars WLP (or memory cell transistors MC) are arranged at a predetermined arrangement pitch P1 along the X direction. A plurality of word line pillars WLP adjacent thereto in the Y direction are also arranged at the predetermined arrangement pitch P1 along the X direction, and are arranged to be shifted by P1/2 in the X direction.

In addition, near the center of the memory cell region in the X direction, a plurality of insulating pillars HR1 are arranged to be separated from each other by a predetermined distance in the Y direction. The insulating pillars HR1 are arranged in every other row in the Y direction with respect to the rows of the word line pillars WLP arranged in the X direction. Each insulating pillar HR1 is arranged between two word line pillars WLP arranged in the X direction. In other words, in the word line pillars WLP arranged in the X direction and the Y direction, one column of the word line pillars WLP arranged in the Y direction is replaced with the insulating pillars HR1.

Further, in the example of FIG. 6, on both sides of one column of insulating pillars HR1 arranged in the Y direction, one column (or a plurality of columns) of word line pillars WLP adjacent thereto in the X direction may be set as dummy word line pillars DWLP. The memory cell transistors provided in the dummy word line pillars DWLP are set as dummy memory cell transistors (hereinafter also referred to as dummy cells). Note that the number of dummy word line pillars DWLP (i.e., dummy memory cell transistors) can be freely set and may be zero.

Hereinafter, a configuration of the SGD region will be described.

As shown in FIG. 2, in the SGD region, the select gates SGD are provided on the side surfaces of the semiconductor layers 31 via gate oxide layers.

Further, a plurality of (12 in the example of FIG. 6) contact plugs CBL are coupled to their respective semiconductor layers 31 arranged along the Y direction. In the example of FIG. 6, the contact plugs CBL are provided to be in a four-line (column) staggered arrangement along the Y direction. That is, a four-column pattern in which four contact plugs CBL adjacent in the Y direction are arranged with their positions varying in the X direction is repeated in the Y direction.

The four-line staggered arrangement will be described below. For example, the contact plugs CBL1 to CBL4 are arranged with their positions sequentially shifted in the X direction. Specifically, the contact plug CBL2 adjacent to the contact plug CBL1 is provided at a position different from the contact plug CBL1 in the X direction. The contact plug CBL3 adjacent to the contact plug CBL2 is provided at a position different from the contact plugs CBL1 and CBL2 in the X direction. Similarly, the contact plug CBL4 adjacent to the contact plug CBL3 is provided at a position different from the contact plugs CBL1, CBL2, and CBL3 in the X direction.

At this time, for example, the contact plugs CBL1 to CBL4 are arranged such that a distance between the contact plugs CBL1 and CBL2, a distance between the contact plugs CBL2 and CBL3, and a distance between the contact plugs CBL3 and CBL4 in the X direction are substantially the same.

Such a four-line staggered arrangement is repeated in the Y direction. For example, the contact plug CBL5 adjacent to the contact plug CBL4 in the Y direction is arranged at the same position as the contact plug CBL1 in the X direction.

In the four-line staggered arrangement, the positions of the contact plugs CBL1 to CBL4 in the X direction can be freely set. For example, the contact plugs CBL1 to CBL4 need not be arranged at regular intervals in the X direction, and may be arranged in a different order in the X direction. The arrangement of the contact plugs CBL is not limited to the four-line staggered arrangement. For example, the contact plugs CBL may be arranged in a line along the Y direction, and may be in a two-or-more-line staggered arrangement.

Hereinafter, a configuration of the SGS region will be described.

As shown in FIG. 2, in the SGS region, the select gates SGS are provided on the side surfaces of the semiconductor layers 31 via gate oxide layers.

In addition, two semiconductor layers 31 adjacent to each other along the Y direction are bundled into one and coupled in common to one contact plug CSL. In the example of FIG. 6, two semiconductor layers 31 are coupled in common to one contact plug CSL; however, the semiconductor layers 31 and the contact plugs CSL are not limited to this configuration. For example, one contact plug CSL may be provided for one semiconductor layer 31, and three or more semiconductor layers 31 may be bundled and coupled in common to one contact plug CSL.

A configuration of the select gate contact region will be described below.

In the select gate contact region corresponding to the select gate line SGDL, a plurality of contact plugs CSGD are provided along the Y direction. The contact plugs CSGD pass through a plurality of select gate lines SGDL stacked in the Z direction, and are each electrically coupled to any one of the select gate lines SGDL.

Further, in the select gate contact region corresponding to the select gate line SGDL, a plurality of insulating pillars HR2 that pass through the select gate lines SGDL stacked in the Z direction are provided. The arrangement of the insulating pillars HR2 can be freely set. The insulating pillars HR2 are formed of insulating layers and not electrically coupled to the other interconnects.

Similarly, in the select gate contact region corresponding to the select gate line SGSL, a plurality of contact plugs CSGS are provided along the Y direction. The contact plugs CSGS pass through a plurality of select gate lines SGSL stacked in the Z direction, and are each electrically coupled to any one of the select gate lines SGSL.

Further, in the select gate contact region corresponding to the select gate line SGSL, a plurality of insulating pillars HR2 that pass through the select gate lines SGSL stacked in the Z direction are provided in the same manner as in the select gate contact region corresponding to the select gate line SGDL. The arrangement of the insulating pillars HR2 can be freely set. The insulating pillars HR2 are formed of insulating layers, and not electrically coupled to the other interconnects.

1.1.4.2 Cross-Sectional Structure of Memory Cell Array

Figure 7:
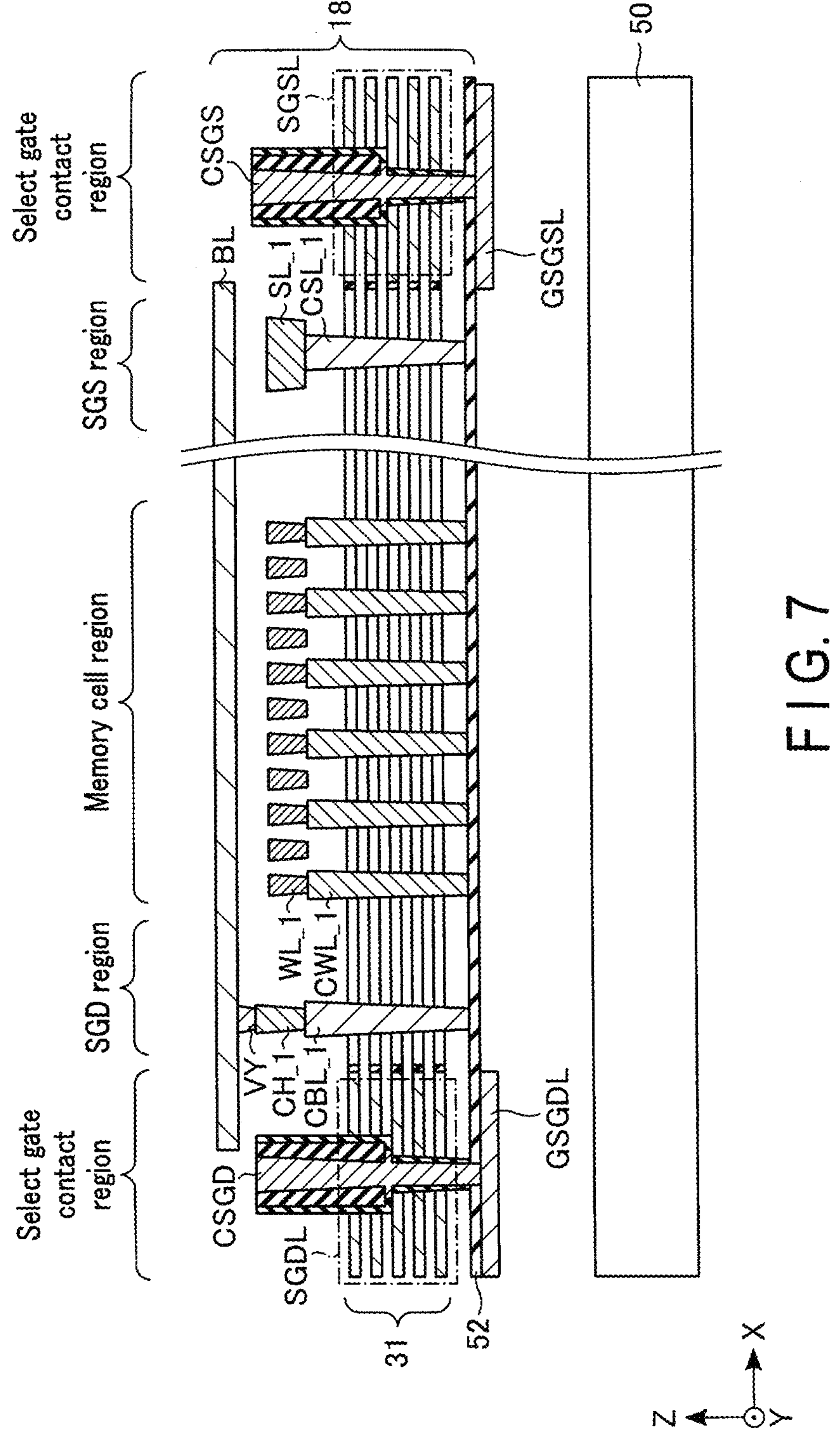
FIG. 7 is a cross-sectional view of the memory cell array in the first embodiment, taken along an X direction.

Next, an example of a cross-sectional structure of the memory cell array 18 will be described with reference to FIG. 7. FIG. 7 is a cross-sectional diagram of the memory cell array 18, taken along the X direction. In FIG. 7, some of the insulating layers are omitted.

The memory cell array 18 is provided above a semiconductor substrate 50.

The global select gate lines GSGDL and GSGSL are provided above the semiconductor substrate 50. An insulating layer 52 is provided on the global select gate lines GSGDL and GSGSL.

The stacked semiconductor layers 31 are provided above the insulating layer 52. A contact plug CWL_1 (or a word line pillar WLP) is provided in the semiconductor layers 31 in the memory cell region so as to pass through the semiconductor layers 31. A word line WL_1 is provided on the contact plug CWL_1.

A contact plug CBL_1 is provided in the semiconductor layers 31 in the SGD region so as to pass through the semiconductor layers 31. A contact plug CH_1 is provided on the contact plug CBL_1. A contact plug VY is provided on the contact plug CH_1. Further, a bit line BL extending in the X direction is provided on the contact plug VY.

A contact plug CSL_1 is provided in the semiconductor layers 31 in the SGS region so as to pass through the semiconductor layers 31. Further, a source line SL_1 is provided on the contact plug CSL_1.

The contact plug CSGD in the select gate contact region is coupled to any one of the select gate lines SGDL, and a bottom surface of the contact plug CSGD is coupled to the global select gate line GSGDL.

Similarly, the contact plug CSGS is coupled to any one of the select gate lines SGSL, and a bottom surface of the contact plug CSGS is coupled to the global select gate line GSGSL.

Figure 8:
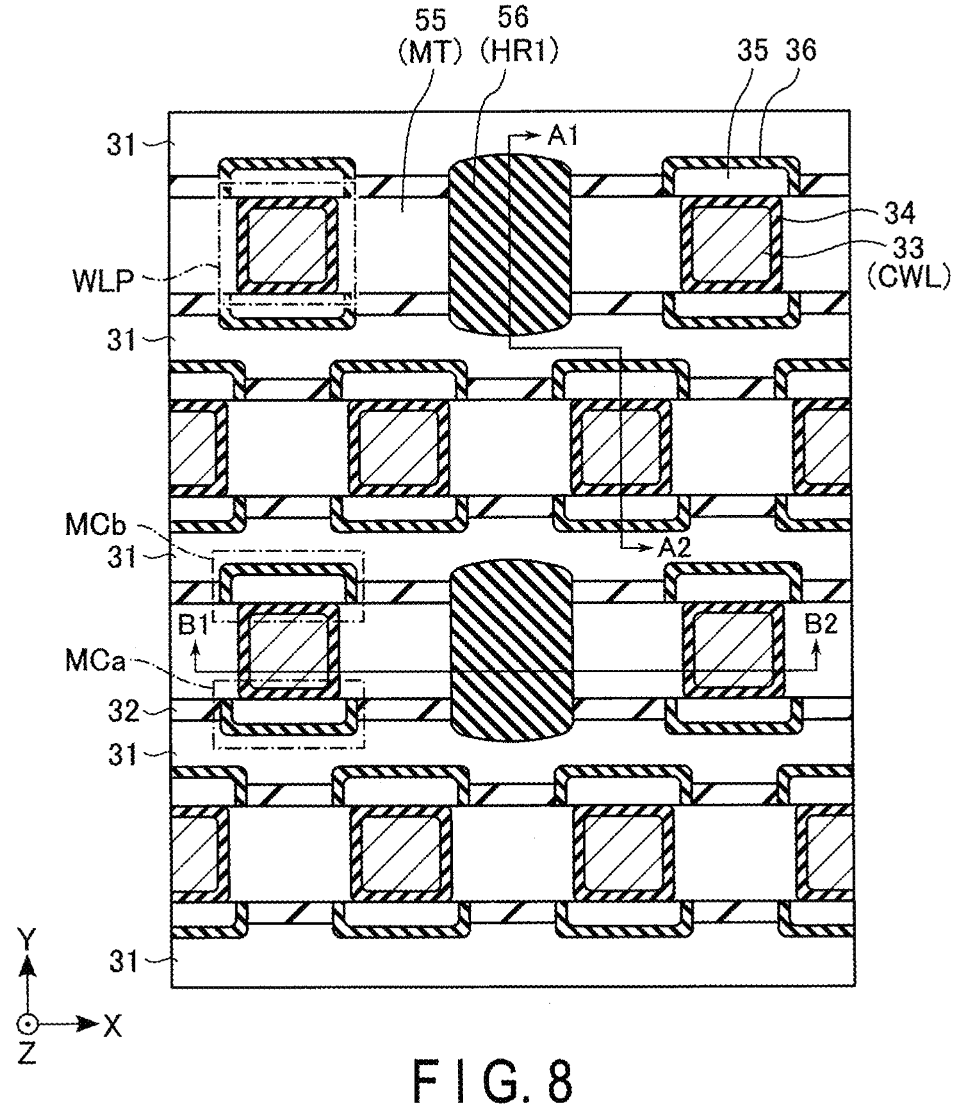
FIG. 8 is an enlarged diagram of a memory cell region in the first embodiment.

1.1.5 Layout Configuration and Cross-Sectional Structure of Memory Cell Region 1.1.5.1 Layout Configuration of Memory Cell Region A layout configuration of the memory cell region in the memory cell array 18 will be described with reference to FIG. 8. FIG. 8 is an enlarged diagram of a region RA in FIG. 6, and shows a layout configuration including the insulating pillars HR1 near the center in the memory cell region. In the example of FIG. 8, some of the insulating layers are omitted.

As shown in FIG. 8, a plurality of semiconductor layers 31 each extend in the X direction. The semiconductor layers 31 are arranged to be separated from each other by a predetermined distance along the Y direction. The semiconductor layers 31 contain, for example, polysilicon doped with impurities.

A memory trench MT is provided between two semiconductor layers 31 arranged along the Y direction. The memory trench MT is a groove provided to divide the semiconductor layers 31 along the Y direction, and an insulating layer 55 is embedded in the memory trench MT. The insulating layer 55 contains, for example, silicon oxide ($SiO_2$).

An insulating layer 32 is provided between the semiconductor layer 31 and the insulating layer 55. The insulating layer 32 functions as an etching stopper when a tunnel insulating layer 36 and a charge storage layer 35 (to be described later) are formed. The insulating layer 32 contains, for example, silicon nitride.

In the memory trench MT, a plurality of word line pillars WLP are arranged to be separated from each other by a predetermined distance in the X direction so as to divide the insulating layer 55 along the X direction. Each word line pillar WLP includes a conductive layer 33 (or contact plug CWL) and an insulating layer 34 extending in the Z direction. The conductive layer 33 is electrically coupled to a word line WL provided thereabove, and functions as the control gate (or word line) of the memory cell transistor MC. A conductive material is used for the conductive layer 33. The conductive material may be a metal material, a metal compound, or a semiconductor material doped with impurities. The conductive layer 33 contains, for example, tungsten (W) and titanium nitride (TiN). TiN is used as a barrier metal when W is formed by chemical vapor deposition (CVD).

The insulating layer 34 is provided on the X and Y-directional side surfaces of the conductive layer 33. The insulating layer 34 functions as the block insulating layer that prevents a charge stored in the charge storage layer 35 from diffusing into the conductive layer 33 (word line). An insulating material is used for the insulating layer 34. As the insulating material, for example, a high-dielectric-constant film such as oxide or nitride of aluminum (Al), hafnium (Hf), titanium (Ti), zirconium (Zr), lanthanum (La), or the like, a high withstand voltage film such as silicon oxide, silicon oxynitride, or the like, or a mixture or stacked film thereof is used.

The charge storage layer 35 and the tunnel insulating layer 36 are provided in order from the word line pillar WLP side between the word line pillar WLP and each corresponding semiconductor layer 31. Specifically, the charge storage layer 35 is arranged between the insulating layer 34 and each semiconductor layer 31. Further, the tunnel insulating layer 36 is arranged between the charge storage layer 35 and the semiconductor layer 31.

The charge storage layer 35 has a function of storing a charge injected from the semiconductor layer 31 in the memory cell transistor MC. As described above, the charge storage layer 35 may be of, for example, an FG type, which uses a conductive layer, or a MONOS type, which uses an insulating layer. Charge storage layers 35 of both the FG type, which uses a conductive layer, and the MONOS type, which uses an insulating layer, may be used. Hereinafter, the case where the charge storage layers 35 are of the FG type will be described.

For the charge storage layer 35, for example, silicon is used, examples of which include a silicon nitride, a metal nitride such as a tantalum nitride (TaN) and a titanium nitride (TiN), a metal silicon compound such as tungsten (W) and ruthenium (Ru), silicon or an insulating film mixed with metal fine particles, or a mixture or stacked film thereof.

For the tunnel insulating layer 36, for example, a mixture or stacked film of silicon oxide ($SiO_2$), silicon nitride (SiN), or silicon oxynitride (SiON) may be used.

In other words, the charge storage layer 35, the tunnel insulating layer 36, and the semiconductor layer 31 are provided at a first end and a second end of the word line pillar WLP in the Y direction. Specifically, the block insulating layer 34 is arranged to surround the conductive layer 33, a first charge storage layer 35 is arranged at a first end of the block insulating layer 34 in the Y direction, a first tunnel insulating layer 36 is arranged on a side surface of the first charge storage layer 35 in the Y direction, and the semiconductor layer 31 is arranged on a side surface of the first tunnel insulating layer 36 in the Y direction. These conductive layer 33, block insulating layer 34, first charge storage layer 35, first tunnel insulating layer 36, and semiconductor layer 31 constitute, for example, a memory cell transistor MCa.

Similarly, a second charge storage layer 35 is arranged at a second end of the block insulating layer 34 in the Y direction, a second tunnel insulating layer 36 is arranged on a side surface of the second charge storage layer 35 in the Y direction, and further the semiconductor layer 31 is arranged on a side surface of the second tunnel insulating layer 36 in the Y direction. These conductive layer 33, block insulating layer 34, second charge storage layer 35, second tunnel insulating layer 36, and semiconductor layer 31 constitute, for example, a memory cell transistor MCb. The insulating layer 55 is arranged at both ends of the word line pillar WLP in the X direction.

In addition, as shown in FIG. 8, the plurality of insulating pillars HR1 are each arranged between two word line pillars WLP in the X direction, and are arranged in a line in the Y direction. Between two semiconductor layers 31, the word line pillar WLP, the insulating pillar HR1, and the word line pillar WLP are sequentially arranged at a predetermined arrangement pitch along the X direction. The insulating layer 55 (or memory trench MT) is arranged between the word line pillar WLP and the insulating pillar HR1. In other words, in the configuration in which first, second, and third word line pillars WLP are sequentially arranged at a predetermined arrangement pitch along the X direction, the second word line pillar WLP is replaced with the insulating pillar HR1.

1.1.5.2 Cross-Sectional Structure of Memory Cell Region

Figure 10:
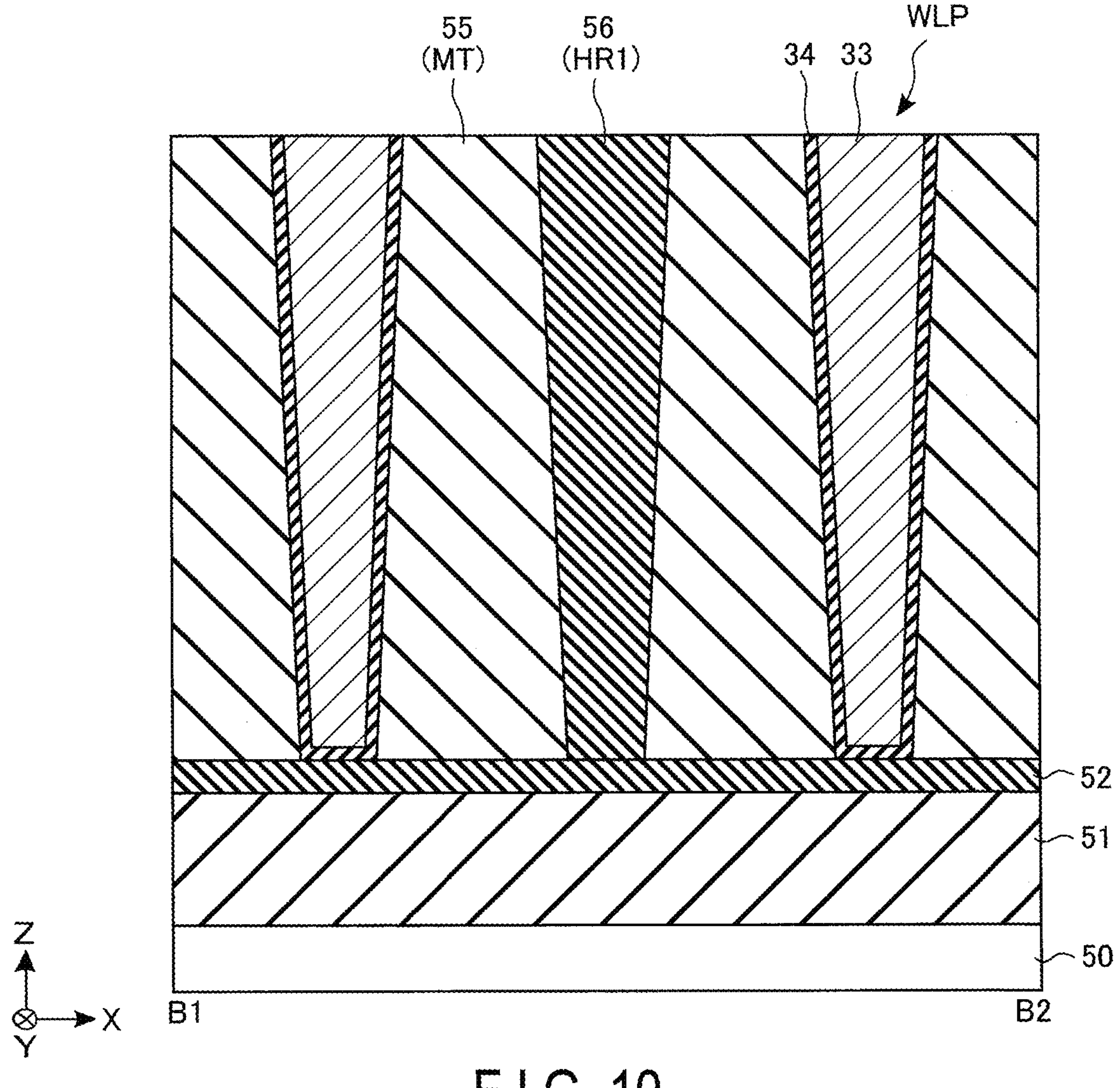
FIG. 10 is a cross-sectional view of the memory cell region in the first embodiment, taken along line B1-B2.

Next, a cross-sectional structure of the memory cell region in the memory cell array 18 will be described with reference to FIGS. 9 and 10. FIG. 9 is a cross-sectional view of the memory cell region in the memory cell array 18, taken along line A1-A2 (or the Y direction). FIG. 10 is a cross-sectional view of the memory cell region in the memory cell array 18, taken along line B1-B2 (or the X direction).

As shown in FIGS. 9 and 10, an insulating layer 51 is provided on the semiconductor substrate 50. The insulating layer 51 may include, for example, a transistor (not shown) or a plurality of interconnect layers (not shown) formed on the semiconductor substrate 50. The insulating layer 51 contains, for example, silicon oxide ($SiO_2$).

The memory cell array 18 is provided on the insulating layer 51. Specifically, the insulating layer 52 is provided on the insulating layer 51. The insulating layer 52 functions as an etching stopper when the memory trenches MT and holes used for various contact plugs, etc. are processed. The insulating layer 52 may be any insulating material that can achieve a sufficient etching selectivity with respect to insulating layers 53 provided in upper layers. The insulating layer 52 contains, for example, silicon nitride (SiN) or a metal oxide such as an aluminum oxide (A1O).

An insulating layer 53 is provided on the insulating layer 52. The insulating layer 53 contains, for example, silicon oxide. On the insulating layer 53, for example, nine semiconductor layers 31 are stacked with the insulating layers 53 respectively interposed therebetween. Namely, nine insulating layers 53 and the nine semiconductor layers 31 are alternately stacked to form a layer stack on the insulating layer 52. The number of stacked semiconductor layers 31 can be freely set. An insulating layer 54 is provided on the uppermost semiconductor layer 31. The insulating layer 54 contains, for example, silicon oxide.

The word line pillar WLP extends in the Z direction to intersect the insulating layer 54 and the alternately-stacked nine semiconductor layers 31 and nine insulating layers 53 (i.e., the layer stack). The word line pillar WLP passes from above the insulating layer 54 in the Z direction between a stack of the insulating layer 54, semiconductor layers 31, and insulating layers 53, and another stack of the insulating layer 54, semiconductor layers 31, and insulating layers 53 adjacent to the aforementioned stack in the Y direction to reach the insulating layer 52.

As described above, the word line pillar WLP includes the conductive layer 33 and insulating layer 34 extending in the Z direction. Specifically, a hole AH is formed in the Z direction so as to intersect the insulating layer 54, semiconductor layers 31, and insulating layers 53. The insulating layer 34 is formed on the side and bottom surfaces of the hole AH. On the side surfaces of the insulating layer 34, the conductive layer 33 is formed to fill the inside of the hole AH.

The charge storage layer 35 and tunnel insulating layer 36 are provided between the insulating layer 34 and each semiconductor layer 31 in order from the insulating layer 34 side. Specifically, the charge storage layer 35 is provided between the insulating layer 34 and each semiconductor layer 31 so as to be in contact with the side surface of the insulating layer 34. Further, the tunnel insulating layer 36 is provided between the charge storage layer 35 and the semiconductor layer 31.

The insulating pillar HR1 extends in the Z direction so as to intersect the insulating layer 54 and the alternately-stacked nine semiconductor layers 31 and nine insulating layers 53. The insulating pillar HR1 passes from above the insulating layer 54 in the Z direction between a stack of the insulating layer 54, semiconductor layers 31, and insulating layers 53, and another stack of the insulating layer 54, semiconductor layers 31, and insulating layers 53 adjacent to the aforementioned stack in the Y direction to reach the insulating layer 52.

As described above, the insulating pillar HR1 includes the insulating layer 56 extending in the Z direction. Specifically, a hole H1 is formed in the Z direction so as to intersect the insulating layer 54, semiconductor layers 31, and insulating layers 53. Further, the insulating layer 56 is formed to fill the inside of the hole H1.

The memory trench MT passes from above the insulating layer 54 in the Z direction between a stack of the insulating layer 54, semiconductor layers 31, and insulating layers 53 and another stack of the insulating layer 54, semiconductor layers 31, and insulating layers 53 adjacent to the aforementioned stack in the Y direction to reach the insulating layer 52. The insulating layer 55 is provided inside the memory trench MT. The insulating layer 32 is further provided between the insulating layer 55 and each semiconductor layer 31.

1.2 Manufacturing Method of Semiconductor Memory Device

In the following, a manufacturing method of the semiconductor memory device according to the first embodiment will be described with reference to FIGS. 11 to 17. FIGS. 11 to 17 are diagrams showing a manufacturing method of a part of the memory cell region and select gate contact region in the memory cell array 18. FIGS. 11 to 17 each show a top surface of the uppermost semiconductor layer 31 ("semiconductor layer top surface") in a manufacturing process, a cross section taken along line A1-A2 (A1-A2 cross section), and a cross section taken along line B1-B2 (B1-B2 cross section).

First, as shown in FIG. 11, the insulating layers 51 and 52 are sequentially stacked on the semiconductor substrate 50. Next, for example, the nine insulating layers 53 and the nine semiconductor layers 31 are alternately stacked on the insulating layer 52. The insulating layer 54 is further formed on the uppermost semiconductor layer 31.

Figure 12:
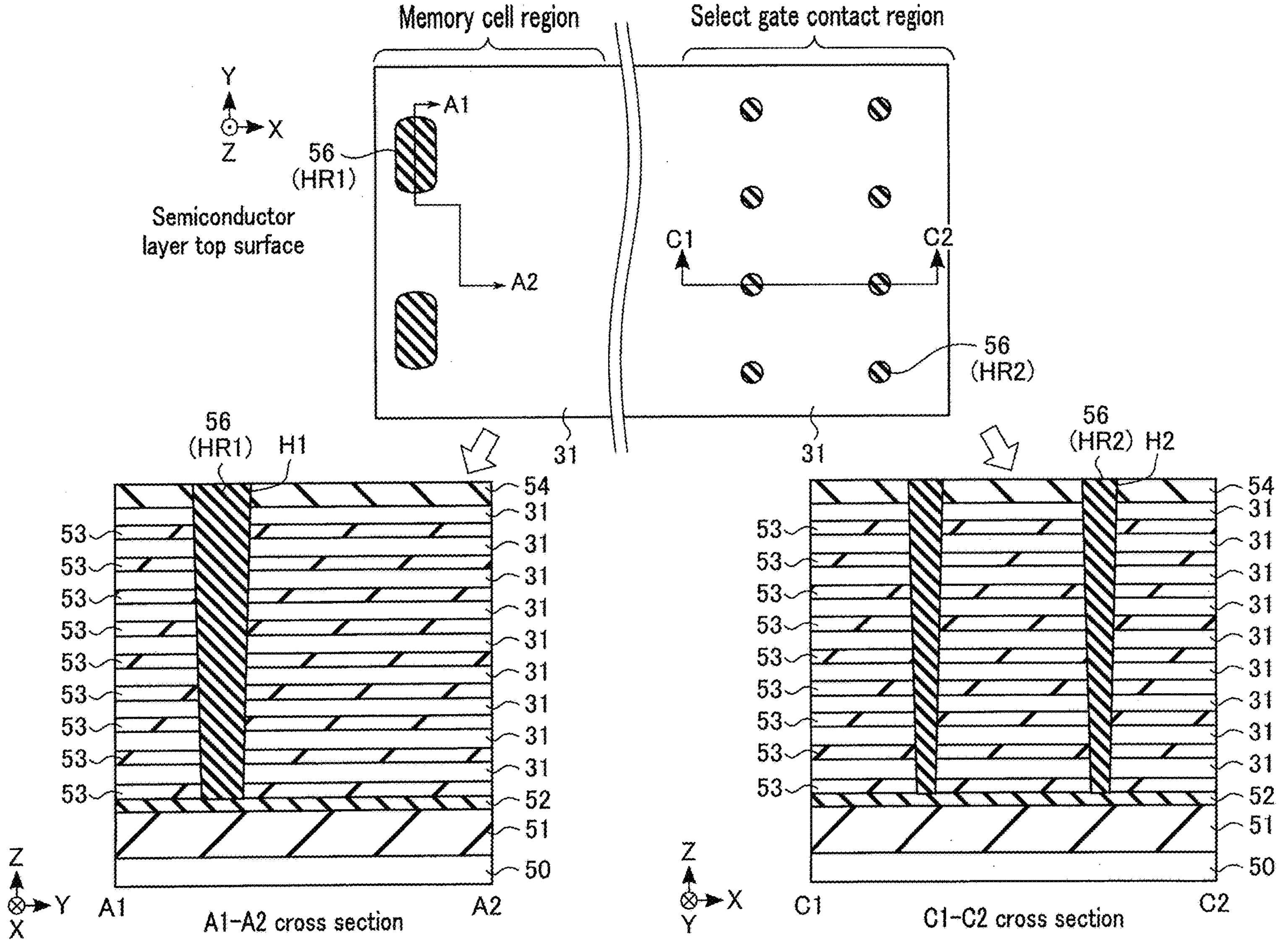

Next, as shown in FIG. 12, insulating pillars HR1 and HR2 are formed in the memory cell region and the select gate contact region, respectively, using the same process. That is, the insulating pillar HR1 is formed in the memory cell region so as to pass through the insulating layer 54, insulating layers 53, and semiconductor layers 31. By using the process for forming this insulating pillar HR1, the insulating pillar HR2 is formed in the select gate contact region so as to pass through the insulating layer 54, insulating layers 53, and semiconductor layers 31.

Specifically, the hole H1 for the insulating pillar HR1, which passes through the insulating layer 54, nine semiconductor layers 31, and nine insulating layers 53 to reach the insulating layer 52 at its bottom, is formed by, for example, dry etching in the memory cell region. By the same step, the hole H2 for the insulating pillar HR2 is formed in the select gate contact region.

Next, the hole HR1 for the insulating pillar H1 in the memory cell region and the hole H2 for the insulating pillar HR2 in the select gate contact region are filled with the insulating layer 56. The insulating layer 56 contains, for example, silicon oxide.

Although the insulating pillars HR1 and HR2 are formed in the memory cell region and the select gate contact region by using the same process, one of the insulating pillars HR1 and HR2 may be formed first, and then the other may be formed.

Figure 13:
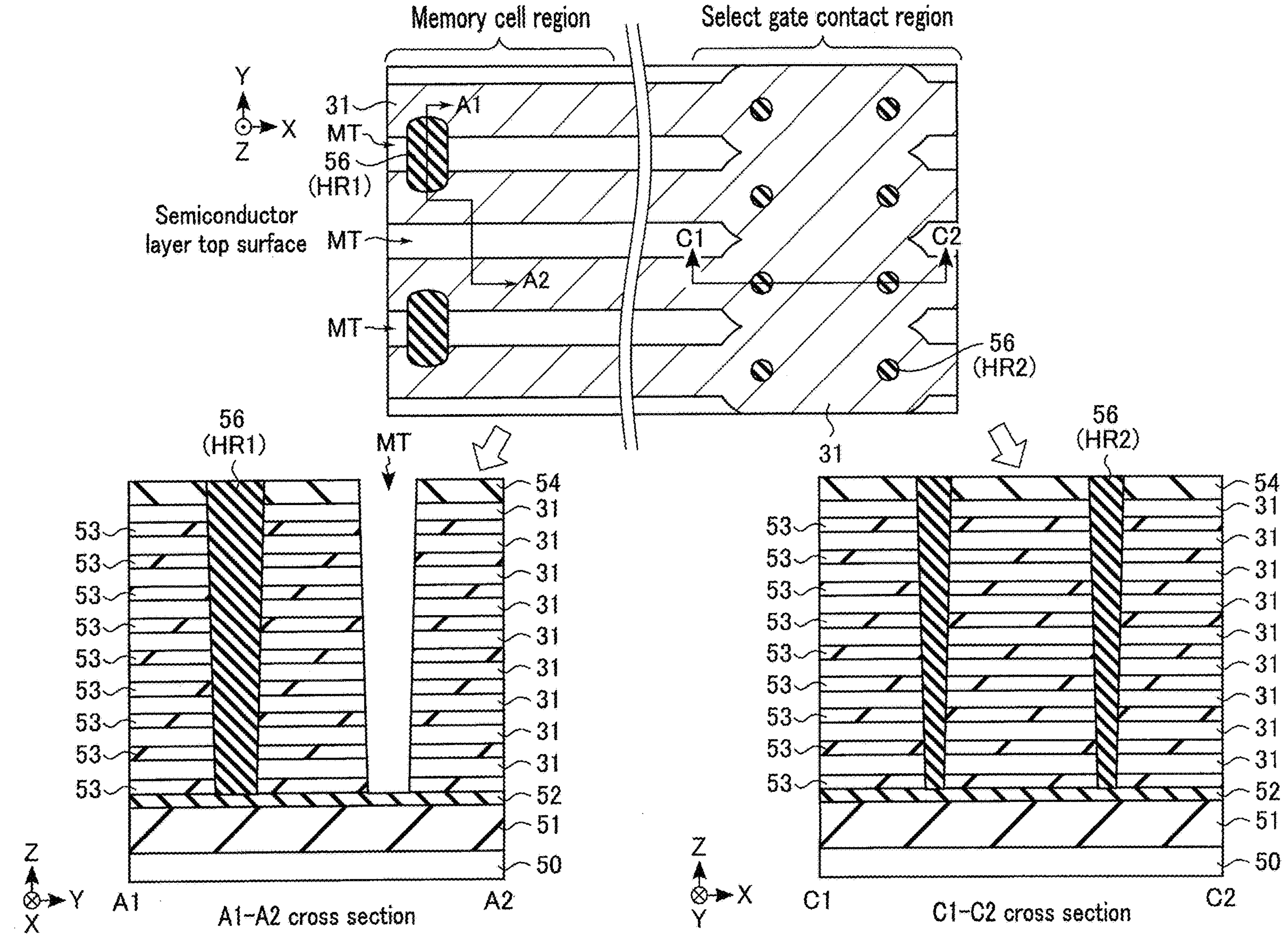

Next, as shown in FIG. 13, a memory trench MT is formed in the memory cell region. Specifically, the memory trench MT, which passes through the insulating layer 54, nine semiconductor layers 31, and nine insulating layers 53 to reach the insulating layer 52 at its bottom, is formed by, for example, dry etching. The insulating pillar HR1 is left intact. At this time, after the memory trench MT is formed, the plurality of stacked semiconductor layers 31 are formed. These stacked semiconductor layers 31 have a high aspect ratio and are likely to collapse (or buckle). In the present embodiment, since the insulating pillar HR1 is arranged between the stacked semiconductor layers 31, it is possible to prevent such a collapse of the semiconductor layers 31.

Figure 14:
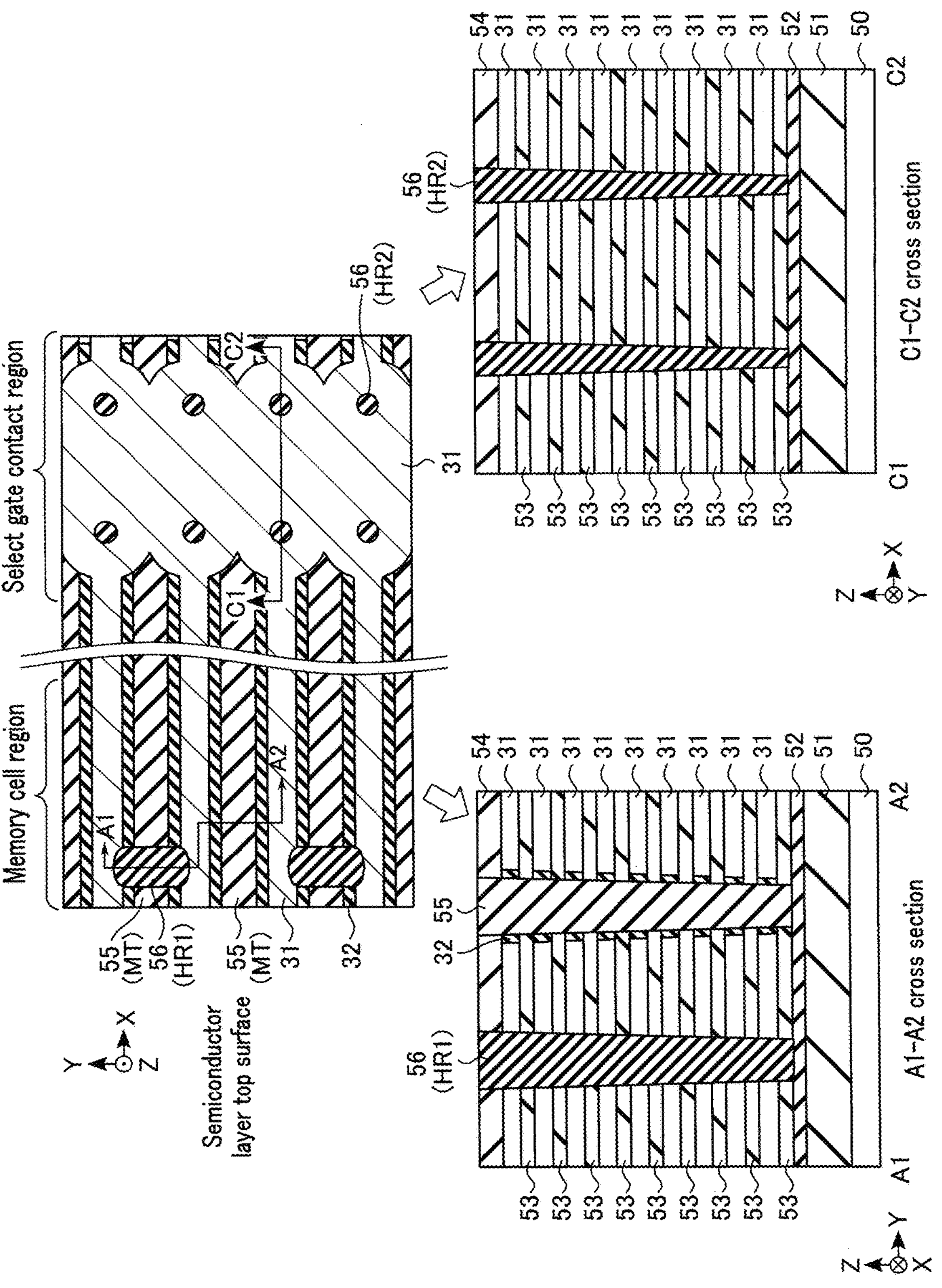

Next, as shown in FIG. 14, the semiconductor layers 31 are each partly removed from the side surface of the memory trench MT, and the insulating layer 32 is formed in the regions from which the semiconductor layers 31 have been removed. Further, the insulating layer 55 is formed in the memory trench MT.

Specifically, the semiconductor layers 31 are each partly etched from the side surface of the open memory trench MT by, for example, wet etching, thereby forming recess regions. Then, the insulating layer 32 is formed on the side and bottom surfaces of the memory trench MT, which include the recess regions, and on the insulating layer 54. The extra insulating layer 32 on the side and bottom surfaces of the memory trench MT and on the insulating layer 54 is removed by etching back (or dry etching), while leaving the insulating layer 32 in the recess regions. Next, the insulating layer 55 is embedded in the memory trench MT by, for example, CVD.

Figure 15:
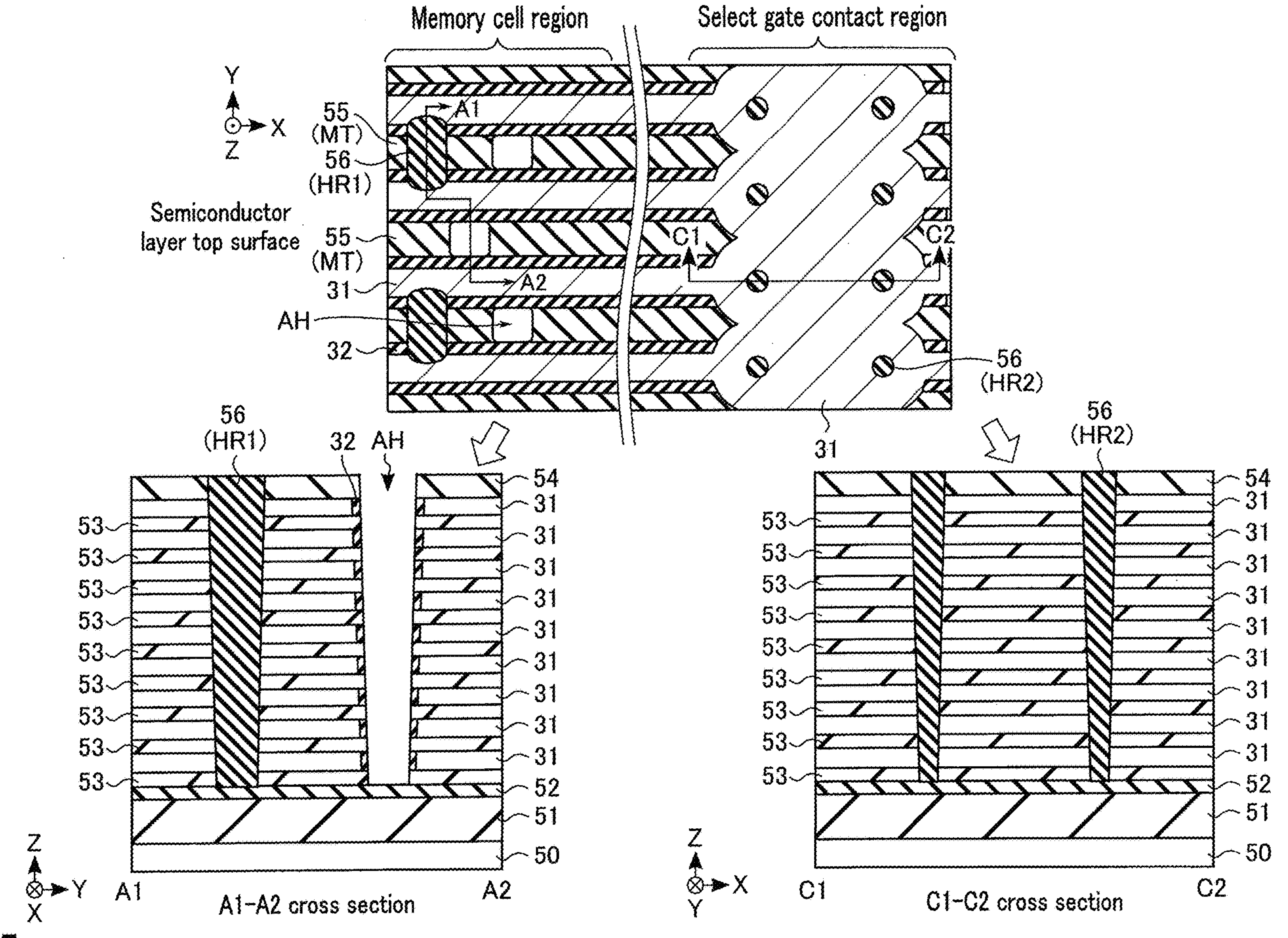

Next, as shown in FIG. 15, the insulating layer 55 is partly removed by, for example, dry etching, thereby forming a hole AH in a region for providing the word line pillar WLP.

Figure 16:
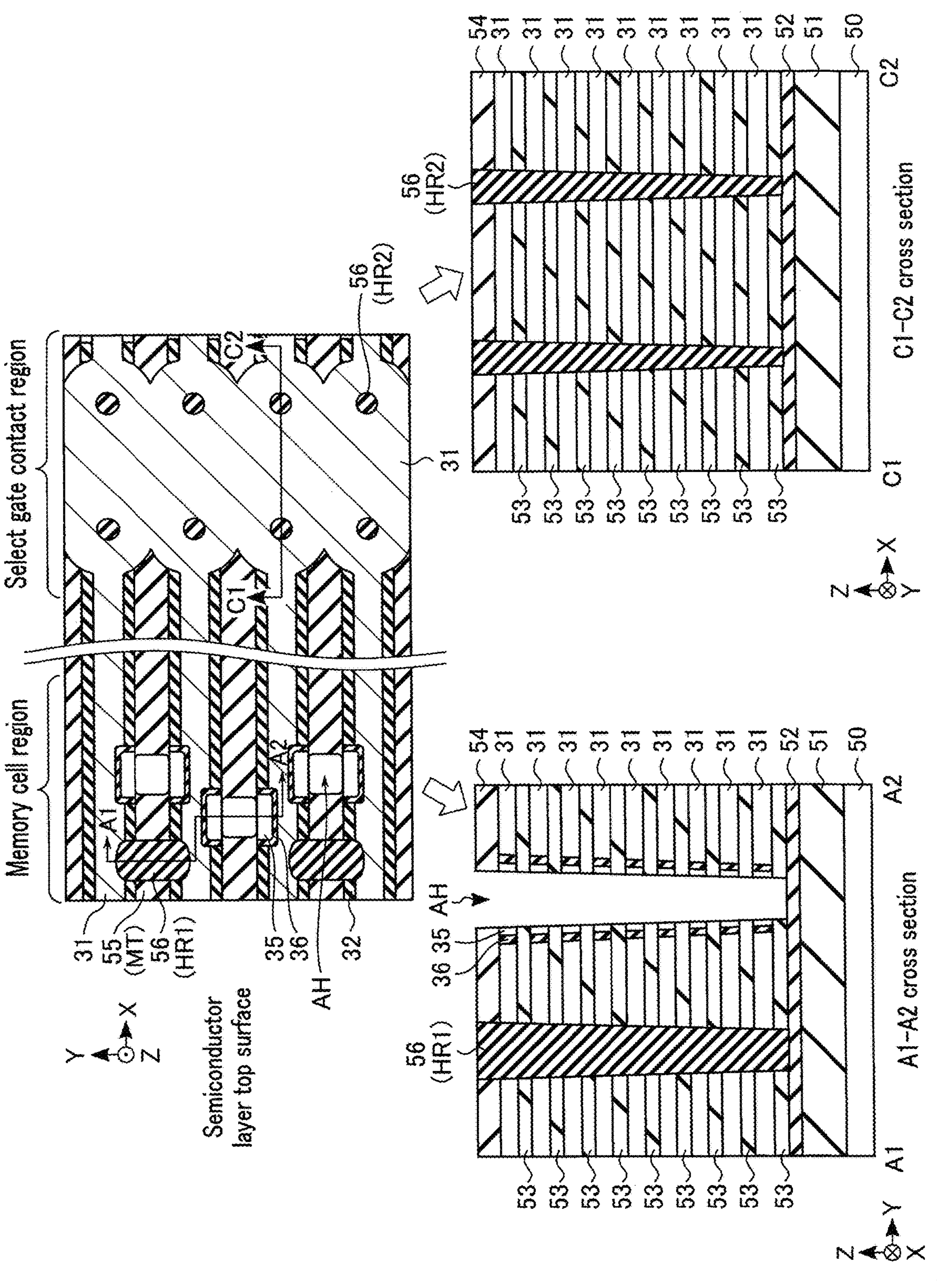

Next, as shown in FIG. 16, the insulating layer 36 and the charge storage layer 35 are formed on Y-directional side surfaces of the hole AH.

Specifically, the insulating layer 32 around the hole AH is removed by, for example, wet etching. The side surface of the semiconductor layer 31 exposed from the hole AH is oxidized by oxidation treatment, thereby forming the insulating layer 36. The charge storage layer 35 is then formed on the side and bottom surfaces of the hole AH and on the insulating layer 54. The extra charge storage layer 35 on the side and bottom surfaces of the hole AH and on the insulating layer 54 is removed by etching back, while leaving the charge storage layer 35 on the side surface of the insulating layer 36.

Figure 17:
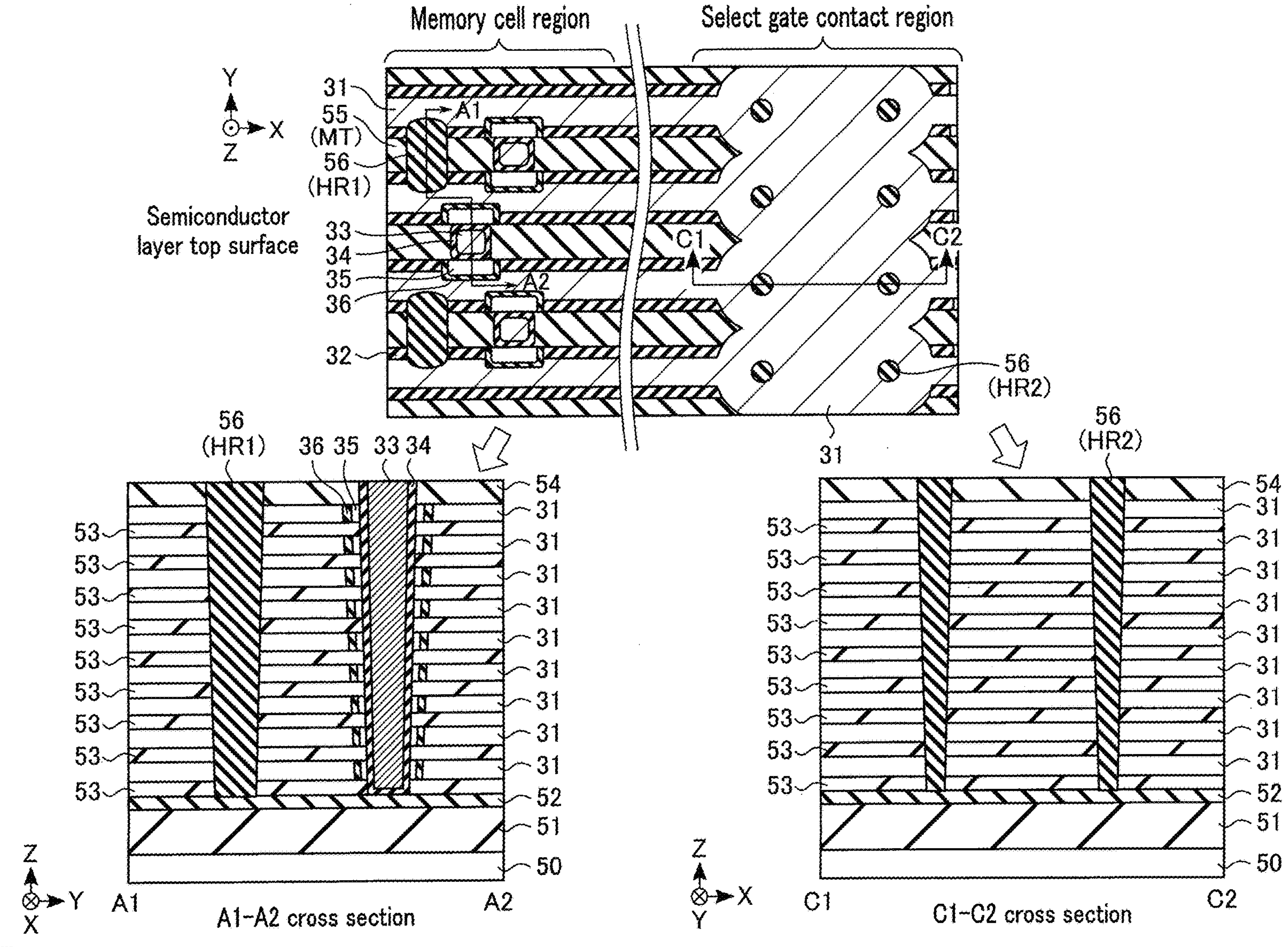

Next, as shown in FIG. 17, the insulating layer 34 is formed on the bottom and side surfaces of the hole AH, and the conductive layer 33 is then formed inside the hole AH.

Specifically, the insulating layer 34 is formed on the bottom and side surfaces of the hole AH by, for example, CVD. Next, for example, TiN and W are sequentially formed as the conductive layer 33 by CVD. Thereafter, TiN and W on the insulating layer 54 are removed by, for example, chemical mechanical polishing (CMP). The memory cell region and the select gate contact region shown in FIG. 17 are formed by the above-described processes.

1.3 Modification of First Embodiment

Next, a semiconductor memory device according to a modification of the first embodiment will be described. Although one column of insulating pillars HR1 arranged in the Y direction is provided in the memory cell region in the layout configuration shown in FIG. 6 of the first embodiment, a plurality of columns of insulating pillars HR1 arranged in the Y direction may be provided depending on an occurrence situation of collapse.

Figure 18:
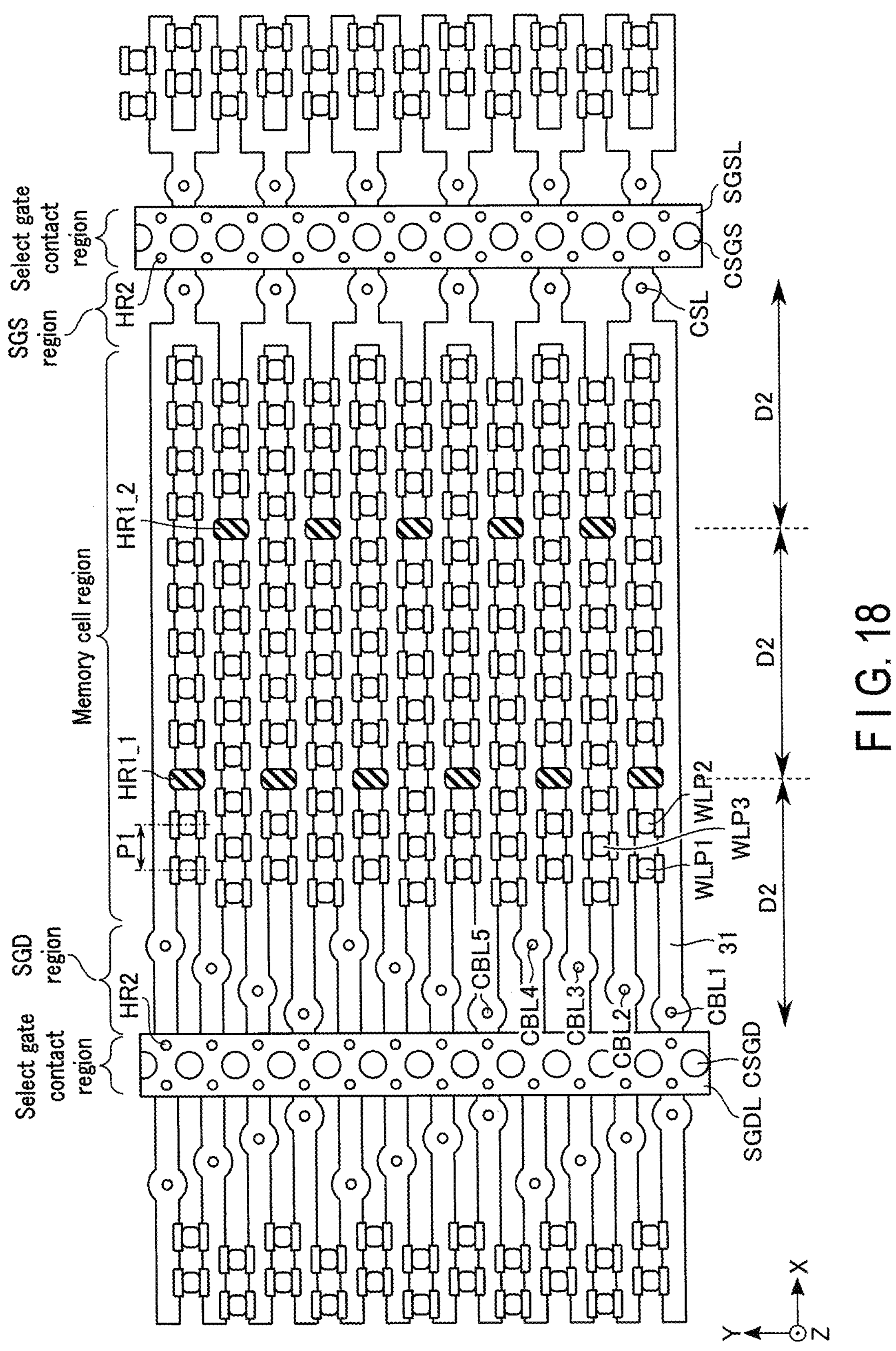
FIG. 18 is a diagram showing a layout configuration of a semiconductor memory device according to a modification of the first embodiment.

FIG. 18 shows a diagram showing a layout configuration of the semiconductor memory device of the modification.

As shown in the figure, insulating pillars HR1_1 arranged in the Y direction are provided in the memory cell region at a distance D2 away from the contact plugs CSGD (or contact plug CBL5). Further, insulating pillars HR1_2 are provided at the distance D2 away from the insulating pillars HR1_1. A distance between the insulating pillars HR1_2 and the contact plugs CSGS (or contact plugs CSL) is also set to be the distance D2. That is, the distance between the insulating pillars HR1_1 and the contact plugs CSGD, the distance between the insulating pillars HR1_1 and the insulating pillars HR1_2, and the distance between the insulating pillars HR1_2 and the contact plugs CSGS are set to be the substantially equal distance D2.

In the modification, in the word line pillars WLP arranged in the X direction and the Y direction, one column of the word line pillars WLP arranged in the Y direction is replaced with the insulating pillars HR1_1 and insulating pillars HR_2.

Here, an example in which two columns of insulating pillars HR1 arranged in the Y direction are arranged in the memory cell region is shown, but the number of columns provided in the memory cell region can be freely set. The other configurations are similar to those of the first embodiment.

1.4 Advantageous Effect of First Embodiment

According to the first embodiment, it is possible to provide a semiconductor memory device capable of reducing the structure collapse. An advantageous effect of the first embodiment will be described below.

The semiconductor memory device has, for example, a layer stack in which a plurality of semiconductor layers 31 and a plurality of insulating layers 53 are stacked in the Z direction. In the manufacturing process of the semiconductor memory device, when a memory trench MT is formed in the layer stack, the layer stack may be divided by the memory trench MT to have a high aspect ratio, and the layer stack may collapse (or buckle) due to stress.

In the first embodiment, the insulating pillars HR1 extending in the Z direction are provided in the layer stack in which the plurality of semiconductor layers 31 and the plurality of insulating layers 53 are stacked in the memory cell region. The insulating pillars HR1 are arranged to be separated from each other by a predetermined distance in the Y direction near the center of the memory cell region in the X direction.

A distance between the insulating pillars HR1 and the contact plugs CSGD (or contact plug CBL), and a distance between the insulating pillars HR1 and the contact plugs CSGS (or contact plugs CSL) are set to be a substantially equal distance D1.

Further, in a configuration in which a plurality of word line pillars WLP (or memory cell transistors MC) are sequentially arranged at a predetermined arrangement pitch along the X direction, one word line pillar WLP is replaced with an insulating pillar HR1.

In the modification, the insulating pillars HR1_1 and HR1_2 extending in the Z direction are provided in the layer stack in which the plurality of semiconductor layers 31 and the plurality of insulating layers 53 are stacked in the memory cell region.

The distance between the insulating pillars HR1_1 and the contact plugs CSGD, the distance between the insulating pillars HR1_1 and the insulating pillars HR1_2, and the distance between the insulating pillars HR1_2 and the contact plugs CSGS are set to be the substantially equal distance D2.

With the above-described configuration, in the first embodiment and the modification, the insulating pillars HR1 or the insulating pillars HR1_1 and HR1_2 support the layer stack, and it is possible to prevent the layer stack in the memory cell region from collapsing (or buckling).

In addition, by forming the insulating pillars HR1 in the memory cell region using the same process as the manufacturing process of the insulating pillars HR2 provided in the select gate contact region, it is possible to prevent an increase in the number of manufacturing processes and to suppress an increase in manufacturing costs.

2. Second Embodiment

Next, a semiconductor memory device according to a second embodiment will be described. In the second embodiment, the word line pillar WLP is not replaced with the insulating pillar HR1 as in the first embodiment, but the insulating pillar HR1 is provided between two word line pillars WLP arranged at a predetermined arrangement pitch. The rest of the circuit configuration, overall configuration, layout configuration, and cross-sectional structure are the same as those of the above-described first embodiment. In the second embodiment, points different from the first embodiment will be mainly described.

2.1 Layout Configuration of Memory Cell Array

Figure 19:
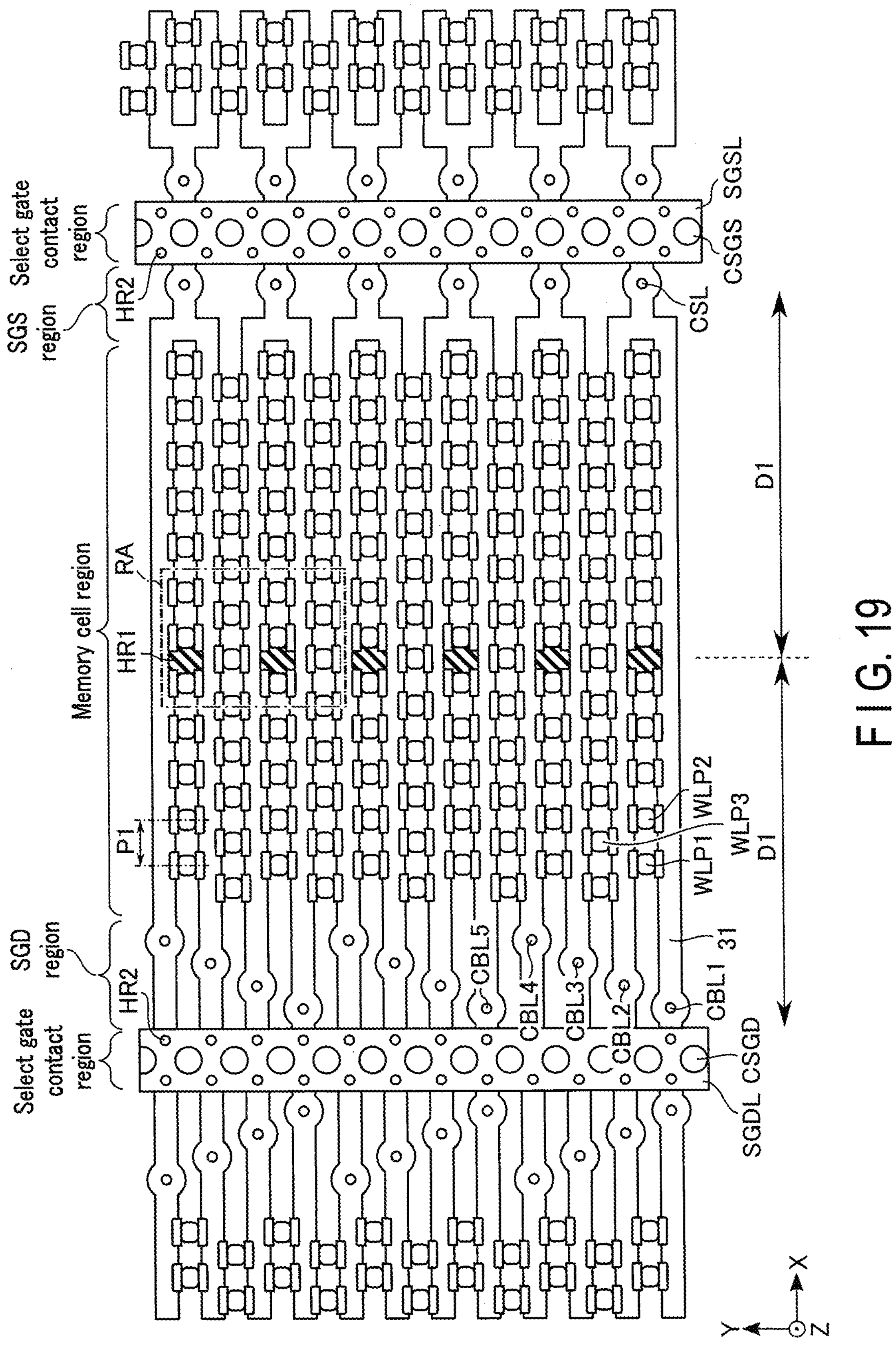
FIG. 19 is a diagram showing a layout configuration of a memory cell array in a second embodiment.

In the following, an example of a layout configuration of the memory cell array 18 will be described with reference to FIG. 19. FIG. 19 is diagram showing the layout configuration of the memory cell array 18, and is a top view of the semiconductor layers 31 and select gate lines SGDL and SGSL in the uppermost layer. In the example of FIG. 19, some of the insulating layers are omitted.

As shown in FIG. 19, the layout configuration of the memory cell array 18 is the same as the configuration shown in FIG. 6 of the first embodiment except for the configuration of the memory cell region.

2.2 Layout Configuration of Memory Cell Region

A layout configuration of the memory cell region in the memory cell array 18 will be described with reference to FIG. 20. FIG. 20 is an enlarged diagram of a region RA in FIG. 19, and shows a layout configuration including the insulating pillars HR1 near the center in the memory cell region. In the example of FIG. 20, some of the insulating layers are omitted.

As shown in FIG. 20, word line pillars WLP (or memory cell transistors MC) are arranged at a predetermined arrangement pitch P1 along the X direction (or row direction). Near the center of the memory cell region in the X direction, a plurality of insulating pillars HR1 are arranged to be separated from each other by a predetermined distance in the Y direction. The insulating pillars HR1 are arranged in every other row in the Y direction with respect to the word line pillars WLP arranged in the X direction. Each insulating pillar HR1 is arranged between two word line pillars WLP arranged at the arrangement pitch P1 in the X direction. Further, each insulating pillar HR1 is in contact with these two word line pillars WLP sandwiching the insulating pillar HR1. The insulating layer 55 is arranged between the word line pillars WLP in which the insulating pillar HR1 is not arranged.

2.3 Modification of Second Embodiment

Next, a semiconductor memory device according to a modification of the second embodiment will be described. In the layout configuration shown in FIGS. 19 and 20 of the second embodiment, an insulating pillar HR1 is provided between two adjacent word line pillars WLP so as to be in contact with these word line pillars WLP. In the modification, an insulating pillar HR1 is provided between two adjacent word line pillars WLP so as not to be in contact with these word line pillars WLP. Further, insulating pillars HR1 are provided in the vicinity of the SGD region of the memory cell region.

Figure 21:
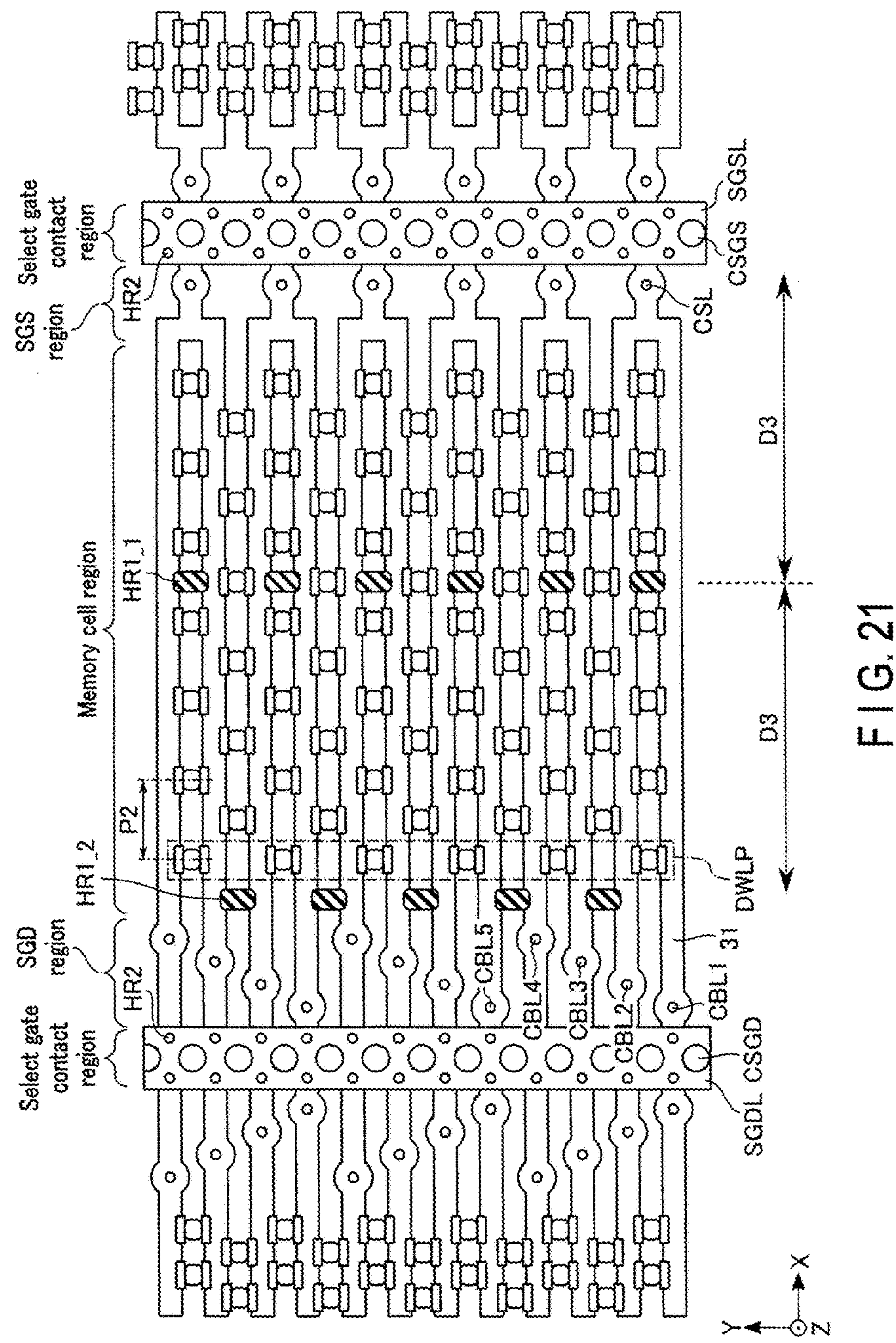
FIG. 21 is a diagram showing a layout configuration of a semiconductor memory device according to a modification of the second embodiment.

FIG. 21 shows a diagram showing a layout configuration of the semiconductor memory device of the modification.

As shown in the figure, a plurality of (six or seven in the example of FIG. 21) word line pillars WLP (or memory cell transistors MC) are arranged at a predetermined arrangement pitch P2 along the X direction (or row direction) between two semiconductor layers 31 in the memory cell region. A plurality of word line pillars WLP adjacent thereto in the Y direction are also arranged at the predetermined arrangement pitch P2 along the X direction, and are arranged to be shifted by P2/2 in the X direction.

Near the center of the memory cell region in the X direction, a plurality of insulating pillars HR1_1 are arranged to be separated from each other by a predetermined distance in the Y direction. The insulating pillars HR1_1 are arranged in every other row in the Y direction with respect to the word line pillars WLP arranged in the X direction. That is, the plurality of insulating pillars HR1_1 are arranged in one column in the Y direction with one word line pillar WLP interposed between any insulating pillars HR1_1 adjacent to each other in the Y direction.

Each insulating pillar HR1_1 is arranged between two word line pillars WLP arranged at the arrangement pitch P2 in the X direction. Each insulating pillar HR1_1 is not in contact with the two word line pillars WLP sandwiching the insulating pillar HR1_1.

In addition, in the vicinity of the SGD region of the memory cell region (or between the memory cell region and the SGD region), a plurality of insulating pillars HR1_2 are arranged to be separated from each other by a predetermined distance in the Y direction. The insulating pillars HR1_2 are arranged at one end of the memory cell region in the X direction. The insulating pillars HR1_2 are not in contact with the adjacent word line pillars WLP.

The insulating pillars HR1_1 arranged in the Y direction are provided at a distance D3 from the contact plugs CSGS (or contact plugs CSL). The insulating pillars HR1_2 arranged in the Y direction are provided at the distance D3 from the insulating pillars HR1_1. That is, a distance between the insulating pillars HR1_1 and the contact plugs CSGS and a distance between the insulating pillars HR1_1 and the insulating pillars HR1_2 are set to be the substantially equal distance D3. The insulating pillars HR1_1 are for preventing collapse of the memory cell region, and the insulating pillars HR1_2 are for preventing collapse of the SGD region.

In the example of FIG. 21, one column (or a plurality of columns) of word line pillars WLP adjacent in the X direction to one column of insulating pillars HR1_2 arranged in the Y direction may be set as dummy word line pillars DWLP. Memory cell transistors provided in the dummy word line pillars DWLP are set as dummy memory cell transistors. Note that the number of dummy word line pillars DWLP (i.e., dummy memory cell transistors) can be freely set and may be zero.

2.4 Advantageous Effect of Second Embodiment

According to the second embodiment, it is possible to provide a semiconductor memory device capable of reducing the structure collapse in the same manner as in the first embodiment.

In the second embodiment, the insulating pillars HR1 extending in the Z direction are provided in the layer stack in which the plurality of semiconductor layers 31 and the plurality of insulating layers 53 are stacked in the memory cell region. The insulating pillars HR1 are arranged to be separated from each other by a predetermined distance in the Y direction near the center of the memory cell region in the X direction.

The distance between the insulating pillars HR1 and the contact plugs CSGD (or contact plug CBL), and the distance between the insulating pillars HR1 and the contact plugs CSGS (or contact plugs CSL) are set to be the substantially equal distance D1.

Further, in the plurality of word line pillars WLP arranged at the arrangement pitch P1 in the X direction, each insulating pillar HR1 is arranged between two adjacent word line pillars WLP so as to be in contact with these two word line pillars WLP.

In the modification, the insulating pillars HR1_1 and HR1_2 extending in the Z direction are provided in the layer stack in which the plurality of semiconductor layers 31 and the plurality of insulating layers 53 are stacked in the memory cell region.

The insulating pillars HR1_1 are arranged to be separated from each other by a predetermined distance in the Y direction near the center of the memory cell region in the X direction. In the plurality of word line pillars WLP arranged at the arrangement pitch P2 in the X direction, each insulating pillar HR1_1 is arranged between two adjacent word line pillars WLP so as not to be in contact with these two word line pillars WLP.

The insulating pillars HR1_2 are arranged to be separated from each other by a predetermined distance in the Y direction between the memory cell region and the SGD region. The distance between the insulating pillars HR1_1 and the contact plugs CSGS and the distance between the insulating pillars HR1_1 and the insulating pillars HR1_2 are set to be the substantially equal distance D3.

With the configuration described above, in the second embodiment and the modification, the insulating pillars HR1 and HR1_1 support the layer stack, and it is possible to prevent the layer stack in the memory cell region from collapsing (or buckling). Further, in the modification, the insulating pillars HR1_2 support the layer stack, and it is possible to prevent the layer stack in the SGD region from collapsing.

Further, in the plurality of word line pillars WLP arranged at the predetermined arrangement pitch P2, since each of the insulating pillars HR1 or the insulating pillars HR1_1 and HR1_2 is arranged between two adjacent word line pillars WLP, the occupancy of the memory cell transistors MC in the memory cell region is not reduced.

In addition, similarly to the first embodiment, by forming the insulating pillars HR1 or the insulating pillars HR1_1 and HR1_2 in the memory cell region using the same process as the manufacturing process of the insulating pillars HR2 provided in the select gate contact region, it is possible to prevent an increase in the number of manufacturing processes and to suppress an increase in the manufacturing costs.

3. Other Modification, Etc

Moreover, although a NAND flash memory is described as an example of the semiconductor memory device in the above-described embodiments, the embodiments can be applied not only to the NAND flash memory but also to other semiconductor memories in general and further to various memory devices other than the semiconductor memories.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:

a first semiconductor layer extending in a first direction;

a second semiconductor layer extending in the first direction and stacked apart from the first semiconductor layer in a second direction intersecting the first direction;

a first conductive layer extending in the second direction and intersecting the first semiconductor layer and the second semiconductor layer;

a first insulating layer extending in the second direction, intersecting the first semiconductor layer and the second semiconductor layer, and provided at a first distance from the first conductive layer in the first direction;

a second conductive layer extending in the second direction, intersecting the first semiconductor layer and the second semiconductor layer, and provided at the first distance from the first insulating layer in the first direction;

a third conductive layer extending in the second direction, intersecting the first semiconductor layer and the second semiconductor layer, and provided at the first distance from the second conductive layer in the first direction;

a first contact plug extending in the second direction, passing through end portions of the first semiconductor layer and the second semiconductor layer in the second direction, and coupled to the first semiconductor layer and the second semiconductor layer; and a second insulating layer extending in the second direction and provided between the third conductive layer and the first contact plug, wherein the second insulating layer is in contact with the first semiconductor layer and the second semiconductor layer.

2. The semiconductor memory device according to claim 1, wherein the first insulating layer is in contact with the first semiconductor layer and the second semiconductor layer.

3. The semiconductor memory device according to claim 1, further comprising:

a third insulating layer extending in the second direction and provided between the first conductive layer and the first insulating layer; and a fourth insulating layer provided between the third insulating layer and the first semiconductor layer.

4. The semiconductor memory device according to claim 1, wherein the first insulating layer is not in contact with the first conductive layer and the second conductive layer.

5. The semiconductor memory device according to claim 1, further comprising:

a fourth conductive layer arranged to be adjacent to the first conductive layer in a third direction intersecting the first direction and the second direction;

a fifth conductive layer arranged to be adjacent to the second conductive layer in the third direction; and a fifth insulating layer arranged to be adjacent to the first insulating layer in the third direction, wherein the fifth insulating layer is arranged between the fourth conductive layer and the fifth conductive layer in the first direction.

6. The semiconductor memory device according to claim 5, further comprising a sixth conductive layer provided between the first conductive layer and the fourth conductive layer in the third direction and provided at a position different from positions of the first conductive layer and the fourth conductive layer in the first direction.

7. The semiconductor memory device according to claim 6, further comprising a second memory cell provided between the first semiconductor layer and the sixth conductive layer.

8. The semiconductor memory device according to claim 1, further comprising a first memory cell provided between the first semiconductor layer and the first conductive layer.

9. The semiconductor memory device according to claim 8, wherein the first memory cell includes:

a second insulating layer provided between the first conductive layer and the first semiconductor layer;

a first charge storage layer provided between the first conductive layer and the second insulating layer; and a third insulating layer provided between the first conductive layer and the first charge storage layer.

10. A semiconductor memory device, comprising:

a first semiconductor layer extending in a first direction;

a second semiconductor layer extending in the first direction and stacked apart from the first semiconductor layer in a second direction intersecting the first direction;

a first conductive layer extending in the second direction and intersecting the first semiconductor layer and the second semiconductor layer;

a first insulating layer extending in the second direction, intersecting the first semiconductor layer and the second semiconductor layer, and provided at a first distance from the first conductive layer in the first direction;

a second conductive layer extending in the second direction, intersecting the first semiconductor layer and the second semiconductor layer, and provided at the first distance from the first insulating layer in the first direction;

a third conductive layer extending in the second direction, intersecting the first semiconductor layer and the second semiconductor layer, and provided at the first distance from the second conductive layer in the first direction;

a first contact plug extending in the second direction, passing through first end portions of the first semiconductor layer and the second semiconductor layer in the second direction, and coupled to the first semiconductor layer and the second semiconductor layer; and a second contact plug extending in the second direction, passing through second end portions of the first semiconductor layer and the second semiconductor layer in the second direction, and coupled to the first semiconductor layer and the second semiconductor layer, wherein a distance between the first insulating layer and the first contact plug is not equal to a distance between the first insulating layer and the second contact plug.

11. A semiconductor memory device comprising:

a first semiconductor layer extending in a first direction;

a second semiconductor layer extending in the first direction and stacked apart from the first semiconductor layer in a second direction intersecting the first direction;

a first conductive layer extending in the second direction and intersecting the first semiconductor layer and the second semiconductor layer;

a second conductive layer extending in the second direction, intersecting the first semiconductor layer and the second semiconductor layer, and provided at a first distance from the first conductive layer in the first direction;

a third conductive layer extending in the second direction, intersecting the first semiconductor layer and the second semiconductor layer, and provided at the first distance from the second conductive layer in the first direction;

a first insulating layer extending in the second direction and provided between the first conductive layer and the second conductive layer;

a first contact plug extending in the second direction, passing through end portions of the first semiconductor layer and the second semiconductor layer in the second direction, and coupled to the first semiconductor layer and the second semiconductor layer; and a second insulating layer extending in the second direction and provided between the third conductive layer and the first contact plug, wherein the second insulating layer is in contact with the first semiconductor layer and the second semiconductor layer.

12. The semiconductor memory device according to claim 11, wherein the first insulating layer is in contact with the first semiconductor layer and the second semiconductor layer.

13. The semiconductor memory device according to claim 11, wherein the first insulating layer is in contact with the first conductive layer and the second conductive layer.

14. The semiconductor memory device according to claim 11, wherein the first insulating layer is not in contact with the first conductive layer and the second conductive layer.

15. The semiconductor memory device according to claim 11, further comprising:

a third insulating layer extending in the second direction and provided between the second conductive layer and the third conductive layer; and a fourth insulating layer provided between the third insulating layer and the first semiconductor layer.

* * * * *